US012733506B2

(12) United States Patent
Yeh et al.

(10) Patent No.: US 12,733,506 B2
(45) Date of Patent: Sep. 8, 2026

(54) SEMICONDUCTOR DIE PACKAGE AND METHODS OF FORMATION

(71) Applicant: Taiwan Semiconductor Manufacturing Company, Ltd., Hsinchu (TW)

(72) Inventors: Tsung-Hao Yeh, Hsinchu City (TW); Chien Hung Liu, Hsinchu County (TW); Hsien Jung Chen, Tainan City (TW); Hsin Heng Wang, Hsinchu County (TW); Kuo-Ching Huang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 694 days.

(21) Appl. No.: 18/151,084

(22) Filed: Jan. 6, 2023

(65) Prior Publication Data

US 2024/0105644 A1 Mar. 28, 2024

Related U.S. Application Data

(60) Provisional application No. 63/377,418, filed on Sep. 28, 2022.

(51) Int. Cl.

*H10W 90/00* (2026.01)
*H10W 20/00* (2026.01)
*H10W 20/20* (2026.01)
*H10W 42/60* (2026.01)
*H10W 72/00* (2026.01)
*H10W 72/90* (2026.01)

(Continued)

(52) U.S. Cl.

CPC ......... *H10W 42/60* (2026.01); *H10W 20/023* (2026.01); *H10W 20/20* (2026.01);

(Continued)

(58) Field of Classification Search

CPC ....... H01L 23/481; H01L 24/05; H01L 24/08; H01L 24/80

See application file for complete search history.

(56) References Cited

U.S. PATENT DOCUMENTS 9,214,433 B2 12/2015 Xiang et al.
9,349,768 B2 5/2016 Cheng et al.

(Continued)

FOREIGN PATENT DOCUMENTS

CN 104282644 A 1/2015
CN 105264660 A 1/2016

(Continued)

*Primary Examiner* — Trang Q Tran

(74) *Attorney, Agent, or Firm* — Harrity & Harrity, LLP

(57) ABSTRACT

A semiconductor die package includes a high dielectric constant (high-k) dielectric layer over a device region of a first semiconductor die that is bonded with a second semiconductor die in a wafer on wafer (WoW) configuration. A through silicon via (TSV) structure may be formed through the device region. The high-k dielectric layer has an intrinsic negative charge polarity that provides a coupling voltage to modify the electric potential in the device region. In particular, the electron carriers in high-k dielectric layer attracts hole charge carriers in device region, which suppresses trap-assist tunnels that result from surface defects formed during etching of the recess for the TSV structure. Accordingly, the high-k dielectric layer described herein reduces the likelihood of (and/or the magnitude of) current leakage in semiconductor devices that are included in the device region of the first semiconductor die.

20 Claims, 21 Drawing Sheets

(51) Int. Cl.
*H10W 80/00* (2026.01)
*H10W 90/20* (2026.01)

(52) U.S. Cl.
CPC ............ *H10W 90/00* (2026.01); *H10W 72/01* (2026.01); *H10W 72/921* (2026.01); *H10W 72/923* (2026.01); *H10W 72/952* (2026.01); *H10W 72/953* (2026.01); *H10W 80/312* (2026.01); *H10W 80/327* (2026.01); *H10W 90/20* (2026.01); *H10W 90/297* (2026.01); *H10W 90/792* (2026.01); *H10W 90/794* (2026.01)

(56) References Cited

U.S. PATENT DOCUMENTS

| | | | | |
|---|---|---|---|---|
| 9,425,150 | B2 | 8/2016 | Huang et al. | |
| 11,031,462 | B1 | 6/2021 | Chiu | |
| 12,278,167 | B2 | 4/2025 | Chang et al. | |
| 12,484,228 | B2 | 11/2025 | Young et al. | |
| 2016/0329364 | A1* | 11/2016 | Tsai | H01L 21/0206 |
| 2021/0082873 | A1* | 3/2021 | Chen | H01L 24/08 |
| 2021/0098380 | A1 | 4/2021 | Chen et al. | |
| 2021/0118827 | A1* | 4/2021 | Chen | H01L 25/0657 |
| 2022/0130853 | A1 | 4/2022 | Sharangpani et al. | |

FOREIGN PATENT DOCUMENTS

| | | | |
|---|---|---|---|
| CN | 106129073 | A | 11/2016 |
| CN | 112490235 | A | 3/2021 |
| CN | 112687657 | A | 4/2021 |
| CN | 113097181 | A | 7/2021 |
| CN | 113345928 | A | 9/2021 |
| CN | 114765153 | A | 7/2022 |
| TW | 201539696 | A | 10/2015 |
| TW | 201543658 | A | 11/2015 |

* cited by examiner

248

600

SEMICONDUCTOR DIE PACKAGE AND METHODS OF FORMATION

CROSS-REFERENCE TO RELATED APPLICATION

This Patent application claims priority to U.S. Provisional Patent Application No. 63/377,418, filed on Sep. 28, 2022, and entitled "SEMICONDUCTOR DIE PACKAGE AND METHODS OF FORMATION." The disclosure of the prior Application is considered part of and is incorporated by reference into this Patent Application.

BACKGROUND

Various semiconductor device packing techniques may be used to incorporate one or more semiconductor dies into a semiconductor device package. In some cases, semiconductor dies may be stacked in a semiconductor device package to achieve a smaller horizontal or lateral footprint of the semiconductor device package and/or to increase the density of the semiconductor device package. Semiconductor device packing techniques that may be performed to integrate a plurality of semiconductor dies in a semiconductor device package may include integrated fanout (InFO), package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
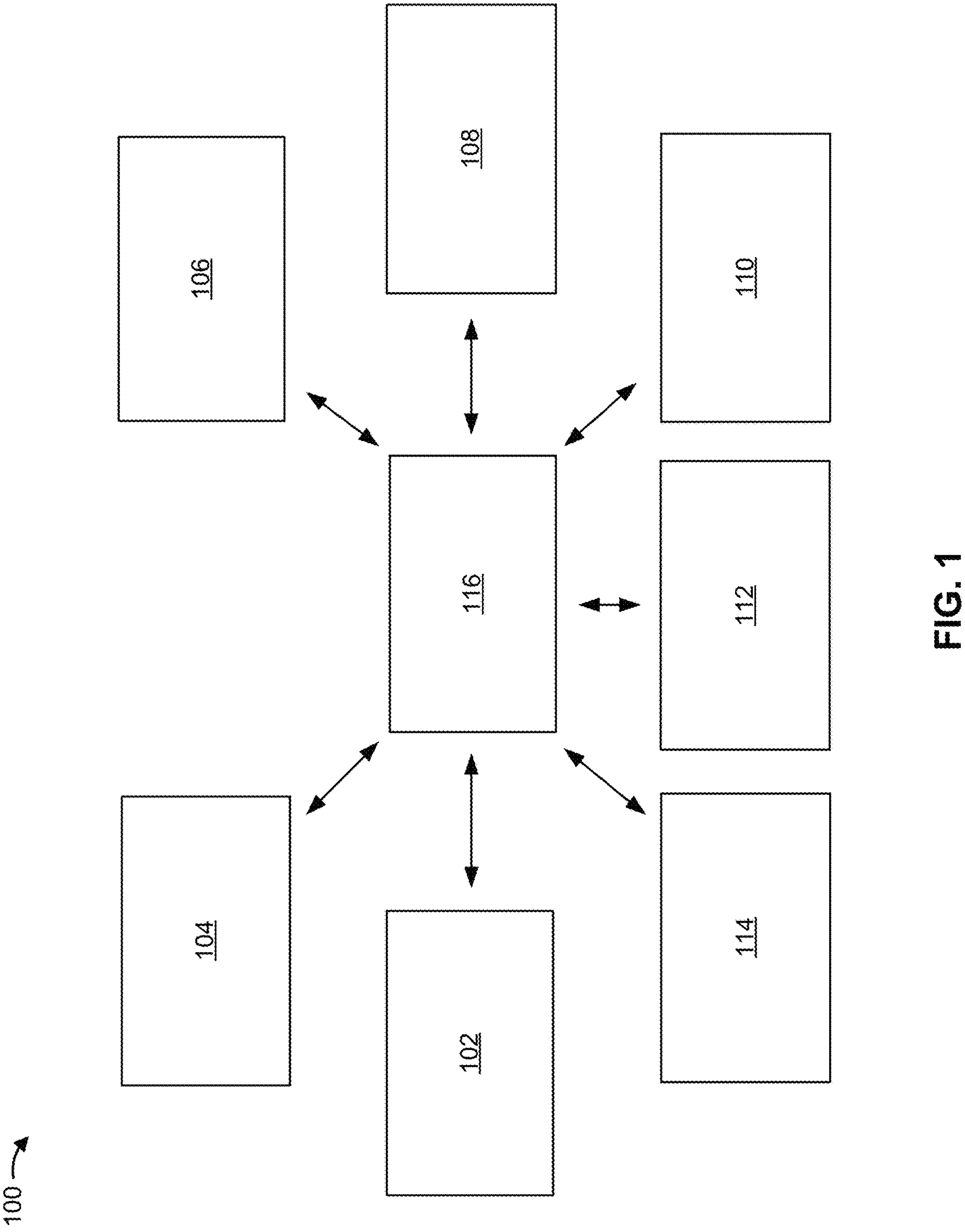
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a wafer on wafer (WoW) semiconductor die package, semiconductor dies are directly bonded such that the semiconductor dies are vertically arranged in the WoW semiconductor die package. The use of direct bonding and vertical stacking of dies may reduce interconnect lengths between the semiconductor dies (which reduces power loss and signal propagation times) and may enable increased density of semiconductor die packages in a semiconductor device package that includes the WoW semiconductor die package.

Through silicon via (TSV) structures may be included in a WoW semiconductor die package. A TSV structure is an elongated conductive structure that extends through a silicon substrate (e.g., a device region) of one or more of the semiconductor dies of the WoW semiconductor die package. A TSV structure may enable a back end of line (BEOL) region of one or more of the semiconductor dies to be electrically connected to a redistribution structure (and to external electrically connectors) of the WoW semiconductor die package.

In some cases, a TSV structure may be located near a semiconductor device (e.g., a transistor or another type of semiconductor device) included in a silicon substrate of a semiconductor die of a WoW semiconductor die package. In particular, the TSV structure may extend through one or more types of doped wells (e.g., a p-doped well, an n-doped well) included in the silicon substrate in which the semiconductor device is included.

Forming the TSV structure through a doped well may include etching the silicon substrate to form a recess through the doped well, and depositing one or more conductive materials in the recess to form the TSV structure. In some cases, the etch operation to form the recess may result in the formation of dangling bonds in the surface of the silicon substrate in the doped well. These dangling bonds may act as charge trapping states, which may cause a trap-assist tunnel (TAT) to form in the silicon substrate. In particular, if the doped well is located adjacent to another doped well of opposite dopant type, the formation of trap-assist tunnels may result in current leakage between the doped well and the adjacent doped well. The current leakage may result in current leakage in a semiconductor device that is formed in the doped well and the adjacent doped well, which may lead to reduced performance for the semiconductor device and/or failure of the semiconductor device. Current leakage may become an increasing occurrence as the pitch or distance between semiconductor devices and TSV structures in WoW semiconductor die packages is decreased so that increased semiconductor device density in the WoW semiconductor die packages can be achieved.

In some implementations described herein, a semiconductor die package (e.g., a WoW semiconductor die package) includes a high dielectric constant (high-k) dielectric layer over a device region (e.g., a silicon substrate) of a first semiconductor die that is bonded with a second semiconductor die in a WoW configuration. A TSV structure (e.g., a backside TSV (BTSV) structure) may be formed through the device region. The high-k dielectric layer has an intrinsic negative charge polarity that provides a coupling voltage to modify the electric potential in the device region. In particular, the negative charges (e.g., electron carriers) in the high-k dielectric layer attracts hole charge carriers in the device region, which suppresses trap-assist tunnels that result from surface defects formed during etching of the recess for the TSV structure. Therefore, the high-k dielectric layer described herein reduces the likelihood of (and/or the magnitude of) current leakage in semiconductor devices that are included in the device region of the first semiconductor die. This may increase the performance of the semiconductor devices and/or may enable the semiconductor devices to be placed closer together and closer to the TSV structure, which enables reduced semiconductor device pitch and increased semiconductor device density in the first semiconductor die, among other examples.

FIG. 1 is a diagram of an example environment 100 in which systems and/or methods described herein may be implemented. As shown in FIG. 1, the example environment 100 may include a plurality of semiconductor processing tools 102-114 and a wafer/die transport tool 116. The plurality of semiconductor processing tools 102-112 may include a deposition tool 102, an exposure tool 104, a developer tool 106, an etch tool 108, a planarization tool 110, a plating tool 112, a bonding tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The bonding tool 114 is a semiconductor processing tool that is capable of bonding two or more work pieces (e.g., two or more semiconductor substrates, two or more semiconductor devices, two or more semiconductor dies) together. For example, the bonding tool 114 may include a hybrid bonding tool. A hybrid bonding tool is a type of bonding tool that is configured to bond semiconductor dies together directly through copper-to-copper (or other direct metal) connections. As another example, the bonding tool 114 may include a eutectic bonding tool that is capable of forming a eutectic bond between two or more wafers together. In these examples, the bonding tool 114 may heat the two or more wafers to form a eutectic system between the materials of the two or more wafers.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the example environment 100 includes a plurality of wafer/die transport tools 116.

For example, the wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102.

In some implementations, one or more of the semiconductor processing tools 102-116 and/or the wafer/die transport tool 116 may perform one or more semiconductor processing operations described herein. For example, one or more of the semiconductor processing tools 102-114 and/or the wafer/die transport tool 116 may bond a first semiconductor die and a second semiconductor die at a bonding interface, where the bonding interface is located on a first side of the second semiconductor die; may form a high-k dielectric layer over a second side of the second semiconductor die opposing the first side, where the high-k dielectric layer has a negative charge polarity; may form, from the second side of the second semiconductor die, a recess through the high-k dielectric layer, through a device region of the second semiconductor die, and into a portion of an interconnection region of the second semiconductor die to expose a portion of a metallization layer in the interconnection region; and/or may form a BTSV structure in the recess.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
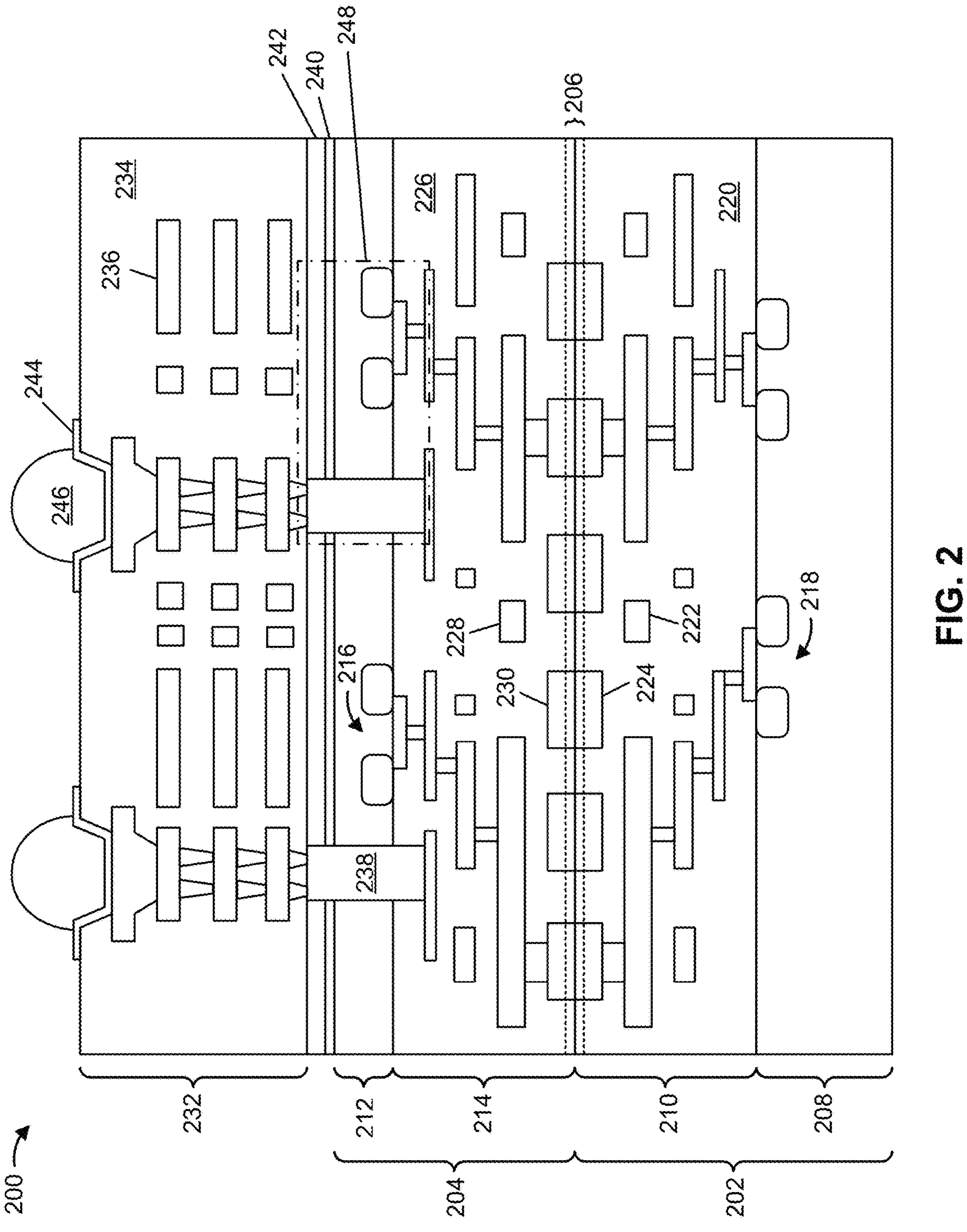
FIG. 2 is a diagram of an example semiconductor die package described herein.

FIG. 2 is a diagram of an example semiconductor die package 200 described herein. The semiconductor die package 200 includes an example of a wafer on wafer (WoW) semiconductor die package or another type of semiconductor die package in which semiconductor dies are directly bonded and vertically arranged or stacked.

As shown in FIG. 2, the semiconductor die package 200 includes a first semiconductor die 202 and a second semiconductor die 204. In some implementations, the semiconductor die package 200 includes additional semiconductor dies. The first semiconductor die 202 may include an SoC die, such as a logic die, a central processing unit (CPU) die, a graphics processing unit (GPU) die, a digital signal processing (DSP) die, an application specific integrated circuit (ASIC) die, and/or another type of SoC die. Additionally and/or alternatively, the first semiconductor die 202 may include a memory die, an input/output (I/O) die, a pixel sensor die, and/or another type of semiconductor die. A memory die may include a static random access memory (SRAM) die, a dynamic random access memory (DRAM) die, a NAND die, a high bandwidth memory (HBM) die, and/or another type of memory die. The second semiconductor 204 may include the same type of semiconductor die as the first semiconductor die 202, or may include a different type of semiconductor die.

The first semiconductor die 202 and the second semiconductor die 204 may be bonded together (e.g., directly bonded) at a bonding interface 206. In some implementations, one or more layers may be included between the first semiconductor die 202 and the second semiconductor die 204 at the bonding interface 206, such as one or more passivation layers, one or more bonding films, and/or one or more layers of another type. In some implementations, a thickness of the second semiconductor die 204 is included in a range of approximately 0.5 microns to approximately 5 microns. However, other values for the range are within the scope of the present disclosure.

The first semiconductor die 202 may include a device region 208 and an interconnect region 210 adjacent to and/or above the device region 208. In some implementations, the first semiconductor die 202 may include additional regions.

Similarly, the second semiconductor die 204 may include a device region 212 and an interconnect region 214 adjacent to and/or below the device region 212. In some implementations, the second semiconductor die 204 may include additional regions. The first semiconductor die 202 and the second semiconductor die 204 may be bonded at the interconnect region 210 and the interconnect region 214. The bonding interface 206 may be located at a first side of the interconnect region 214 facing the interconnect region 210 and corresponding to a first side of the second semiconductor die 204.

The device regions 208 and 212 may each include a silicon (Si) substrate, a substrate formed of a material including silicon, a III-V compound semiconductor material substrate such as gallium arsenide (GaAs), a silicon on insulator (all) substrate, a germanium substrate (Ge), a silicon germanium (SiGe) substrate, a silicon carbide (SiC) substrate, or another type of semiconductor substrate. The device region 212 may include one or more semiconductor devices 216 included in the silicon substrate of the device region 212. The device region 208 may include one or more semiconductor devices 218 included in the silicon substrate of the device region 208. The semiconductor devices 216 and 218 may each include one or more transistors (e.g., planar transistors, fin field effect transistors (FinFETs), nanosheet transistors (e.g., gate all around (GAA) transistors), memory cells, capacitors, inductors, resistors, pixel sensors, and/or another type of semiconductor devices.

The interconnect regions 210 and 214 may be referred to as BEOL regions. The interconnect region 210 may include one or more dielectric layers 220, which may include a silicon nitride ($SiN_x$), an oxide (e.g., a silicon oxide ($SiO_x$) and/or another oxide material), a low dielectric constant (low-k) dielectric material, and/or another type of dielectric material. In some implementations, one or more etch stop layers (ESLs) may be included in between layers of the one or more dielectric layers 220. The one or more ESLs may include aluminum oxide ($Al_2O_3$), aluminum nitride (AlN), silicon nitride (SiN), silicon oxynitride ($SiO_x N_y$), aluminum oxynitride (AlON), and/or a silicon oxide ($SiO_x$), among other examples.

The interconnect region 210 may further include metallization layers 222 in the one or more dielectric layers 220. The semiconductor devices 218 in the device region 208 may be electrically connected and/or physically connected with one or more of the metallization layers 222. The metallization layers 222 may include conductive lines, trenches, vias, pillars, interconnects, and/or another type of metallization layers. Contacts 224 may be included in the one or more dielectric layers 220 of the interconnect region 210. The contacts 224 may be electrically connected and/or physically connected with one or more of the metallization layers 222. The contacts 224 may include conductive terminals, conductive pads, conductive pillars, and/or another type of contacts. The metallization layers 222 and the contacts 224 may each include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

The interconnect region 214 may include one or more dielectric layers 226, which may include a silicon nitride ($SiN_x$), an oxide (e.g., a silicon oxide ($SiO_x$) and/or another oxide material), a low dielectric constant (low-k) dielectric material, and/or another type of dielectric material. In some implementations, one or more etch stop layers (ESLs) may be included in between layers of the one or more dielectric layers 226. The one or more ESLs may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$), among other examples.

The interconnect region 214 may further include metallization layers 228 in the one or more dielectric layers 226. The semiconductor devices 216 in the device region 212 may be electrically connected and/or physically connected with one or more of the metallization layers 228. The metallization layers 228 may include conductive lines, trenches, vias, pillars, interconnects, and/or another type of metallization layers. Contacts 230 may be included in the one or more dielectric layers 226 of the interconnect region 214. The contacts 230 may be electrically connected and/or physically connected with one or more of the metallization layers 228. Moreover, the contacts 230 may be electrically and/or physically connected with the contacts 224 of the first semiconductor die 202. The contacts 230 may include conductive terminals, conductive pads, conductive pillars, UBM structures, and/or another type of contacts. The metallization layers 228 and the contacts 230 may each include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

As further shown in FIG. 2, the semiconductor die package 200 may include a redistribution structure 232. The redistribution structure 232 may include a redistribution layer (RDL) structure and/or another type of redistribution structure. The redistribution structure 232 may be configured to fan out and/or route signals and I/O of the semiconductor dies 202 and 204.

The redistribution structure 232 may include one or more dielectric layers 234 and a plurality of metallization layers 236 disposed in the one or more dielectric layers 234. The dielectric layer(s) 234 may include a silicon nitride ($SiN_x$), an oxide (e.g., a silicon oxide ($SiO_x$) and/or another oxide material), a low dielectric constant (low-k) dielectric material, and/or another suitable dielectric material.

The metallization layers 236 of the redistribution structure 232 may include one or more materials such as a gold (Au) material, a copper (Cu) material, a silver (Ag) material, a nickel (Ni) material, a tin (Sn) material, and/or a palladium (Pd) material, among other examples. The metallization layers 236 of the redistribution structure 232 may include metal lines, vias, interconnects, and/or another type of metallization layers.

As further shown in FIG. 2, the semiconductor die package 200 may include one or more BTSV structures 238 through the device region 212, and into a portion of the interconnect region 214. The one or more BTSV structures 238 may include vertically elongated conductive structures (e.g., conductive pillars, conductive vias) that electrically connect one or more of the metallization layers 228 in the interconnect region 214 of the second semiconductor die 204 to one or more metallization layers 236 in the redistribution structure 232. The BTSV structures 238 may be referred to as through silicon via (TSV) structures in that the BTSV structures 238 extend fully through a silicon substrate (e.g., the silicon substrate of the device region 212) as opposed to extending fully through a dielectric layer or an insulator layer. The one or more BTSV structures 238 may include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

A buffer oxide layer 240 may be included between the second semiconductor die 204 and the redistribution structure 232. In particular, the buffer oxide layer 240 may be included over and/or on the second side of the second semiconductor die 204. The one or more BTSV structures 238 may extend through the buffer oxide layer 240. The buffer oxide layer 240 may include one or more oxide layers that function as a buffer between the device region 212 of the second semiconductor die 204 and the redistribution structure 232. The buffer oxide layer 240 may include one or more oxide materials, such as a silicon oxide ($SiO_x$), a silicon oxycarbide (SiOC), a silicon oxynitride (SiON), and/or another type of oxide material.

A high-k dielectric layer 242 may be included between the second semiconductor die 204 and the redistribution structure 232. In particular, the high-k dielectric layer 242 may be included over the second side of the second semiconductor die 204 and on the buffer oxide layer 240. The one or more BTSV structures 238 may extend through the high-k dielectric layer 242.

The high-k dielectric layer 242 is a layer having a negative charge polarity. In other words, the high-k dielectric layer 242 includes one or more materials having an excess of electron charge carriers. The high-k dielectric layer 242 may have an intrinsic negative charge polarity in that material(s) may be selected for the high-k dielectric layer 242 that have an excess of electron charge carriers. The negative charge polarity of the high-k dielectric layer 242 facilitates attraction of hole charge carriers in the silicon substrate of the device region 212 toward the electron charge carriers in the high-k dielectric layer 242.

As indicated above, dangling bonds that are formed during etching of a recess in which a BTSV structure 238 is formed may act as charge trapping states, which may cause trap-assist tunnels to form in the silicon substrate of the device region 212. The trap-assist tunnels may result in electron current leakage from the p-well 302 to the n-well 304 via the BTSV structure 238. The current leakage may occur through adjacent doped wells associated with the semiconductor device 216. The negative charge polarity of the high-k dielectric layer 242 provides a coupling voltage to modify the electric potential in the silicon substrate of the device region 212. In particular, the electron charge carriers in high-k dielectric layer 242 attracts hole charge carriers in the silicon substrate of the device region 212, which suppresses trap-assist tunnels that result from surface defects formed during etching of the recess for the BTSV structure 238. Therefore, the high-k dielectric layer 242 may reduce the likelihood of (and/or the magnitude of) current leakage in the semiconductor device 216.

In some implementations, a thickness of the high-k dielectric layer 242 is included in a range of approximately 20 angstroms to approximately 500 angstroms to provide a sufficient amount of electron charge carriers in order to attract hold charge carriers in the silicon substrate of the device region 212 and to suppress the trap-assist tunnels. However, other values for the range are within the scope of the present disclosure.

The high-k dielectric layer 242 may include one or more high-k dielectric materials such as a hafnium oxide ($HfO_x$), an aluminum oxide ($Al_xO_y$), a tantalum oxide ($Ta_xO_y$), a gallium oxide ($Ga_xO_y$), a titanium oxide ($TiO_x$), a niobium oxide ($Nb_xO_y$), and/or another suitable high-k dielectric material, among other examples. Additionally and/or alternatively, one or more low-k dielectric materials may be included in the high-k dielectric layer 242. Materials may be selected for the high-k dielectric layer 242 and/or a thickness of the high-k dielectric layer 242 such that a sufficient amount of electron charge carriers is included in the high-k dielectric layer 242.

In some implementations, an equivalent surface charge density of electron charge carriers in the high-k dielectric layer is included in a range of approximately $-8\times10^{-9}$ coulombs per square centimeter ($C/cm^2$) to approximately $-1.6\times10^{-7}$ $C/cm^2$ to provide to provide a sufficient amount of electron charge carriers in order to attract hold charge carriers in the silicon substrate of the device region 212 and to suppress the trap-assist tunnels. However, other values for the range are within the scope of the present disclosure.

UBM layers 244 may be included on a top surface of the one or more dielectric layers 234. The UBM layers 244 may be electrically connected and/or physically connected with one or more metallization layers 236 in the redistribution structure 232. The UBM layers 244 may be included in recesses in the top surface of the one or more dielectric layers 234. The UBM layers 244 may include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

As further shown in FIG. 2, the semiconductor die package 200 may include conductive terminals 246. The conductive terminals 246 may be electrically connected and/or physically connected with the UBM layers 244. The UBM layers 244 may be included to facilitate adhesion to the one or more metallization layers 236 in the redistribution structure 232, and/or to provide increased structural rigidity for the conductive terminals 246 (e.g., by increasing the surface area to which the conductive terminals 246 are connected). The conductive terminals 246 may include ball grid array (BGA) balls, land grid array (LGA) pads, pin grid array (PGA) pins, and/or another type of conductive terminals. The conductive terminals 246 may enable the semiconductor die package 200 to be mounted to a circuit board, a socket (e.g., an LGA socket), an interposer or redistribution structure of a semiconductor device package (e.g., a chip on wafer on substrate CoWoS package, an integrated fanout (InFO) package), and/or another type of mounting structure.

As further shown in FIG. 2, the semiconductor die package 200 may include one or more regions 248 in which a BTSV structure 238 is located near (e.g., adjacent to, next to, and/or through) a semiconductor device 216 in the device region 212 of the second semiconductor die 204. Subsequent figures, such as FIGS. 3A and 3B, may refer to a region 248 in the semiconductor die package 200.

As indicated above, FIG. 2 is provided as an example. Other examples may differ from what is described with regard to FIG. 2.

Figure 3A:
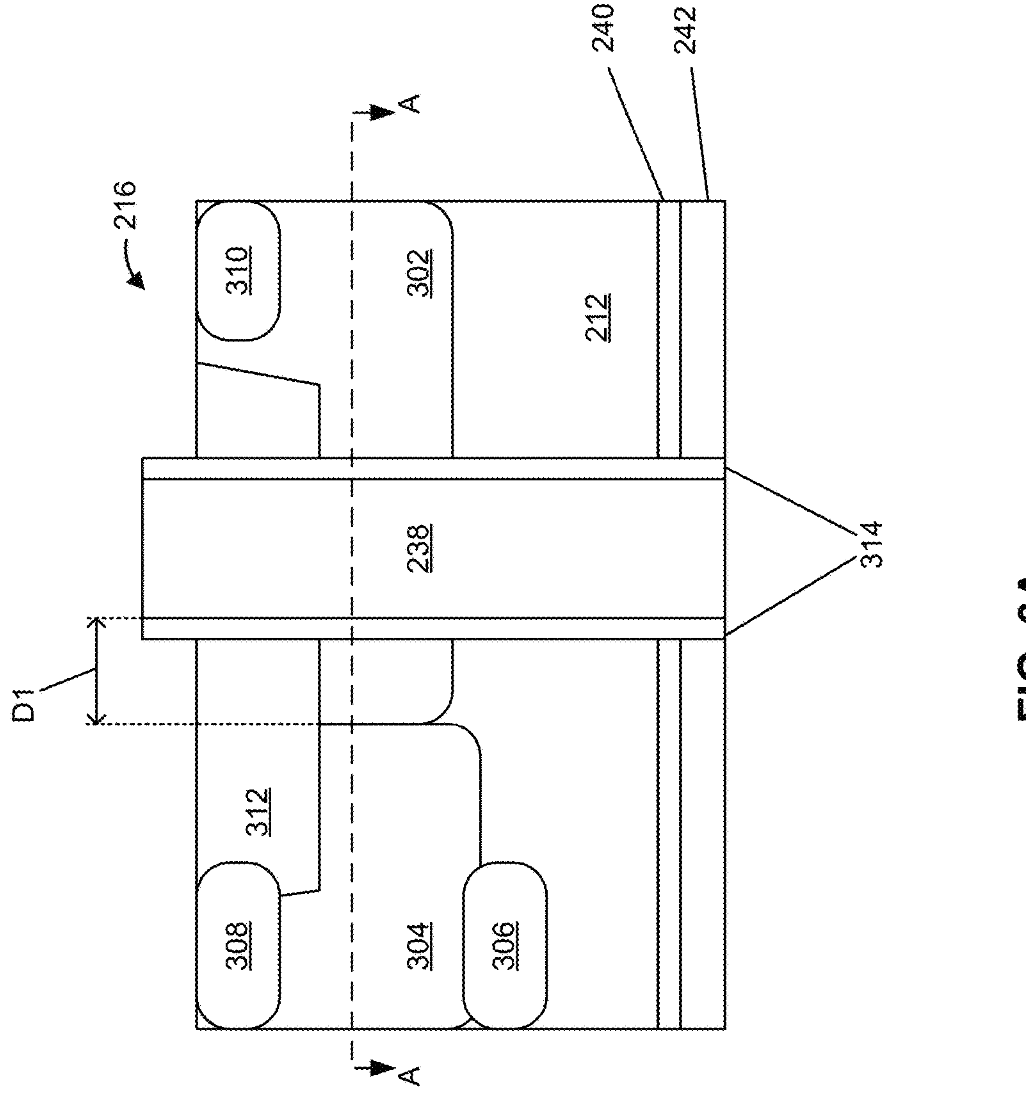
FIGS. 3A and 3B are diagrams of an example implementation of a region of the semiconductor die package described herein.
Figure 3B:
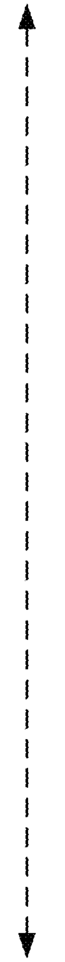
Figure 3B:
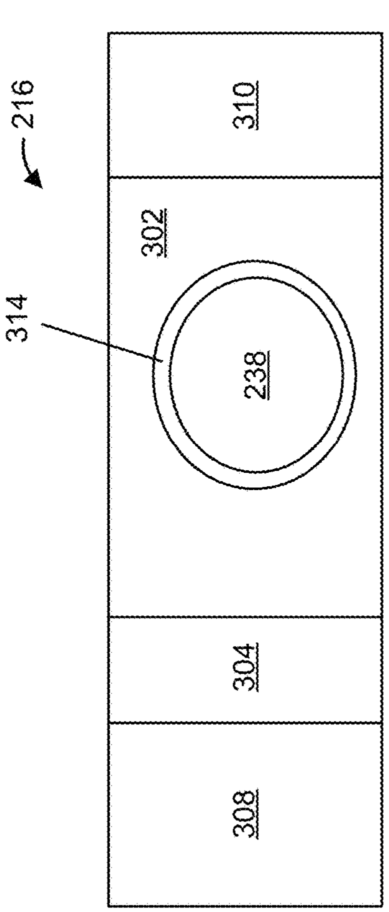

FIGS. 3A and 3B are diagrams of an example implementation of a region 248 of the semiconductor die package 200 described herein. The region 248 may include a BTSV structure 238 that extends adjacent to one or more semiconductor devices 216 in the silicon substrate of the device region 212, and through the buffer oxide layer 240 and the high-k dielectric layer 242.

As shown in FIGS. 3A, a plurality of doped regions may be included in the silicon substrate of the device region 212. For example, a p-well 302 may be included in the silicon substrate of the device region 212. The p-well 302 may include a portion of the silicon substrate that is doped with one or more p-type dopants such as boron (B) or germanium (Ge), among other examples. As another example, an n-well 304 may be in the silicon substrate of the device region 212. The n-well 304 may be included next to (e.g., adjacent to or side-by-side with) the p-well 302 such that edges of the p-well 302 and n-well 304 are interfaced. The n-well 304 may include one or more n-type materials such as phosphorous (P) or arsenic (As), among other examples. In some implementations, additional doped regions are included, such as a deep n-well 306 under the n-well 304.

As further shown in FIG. 3A, the one or more semiconductor devices 216 may include a source/drain region 308 and a source/drain region 310. In some implementations, the source/drain region 308 and the source/drain region 310 are included on opposing sides of the BTSV structure 238. A source/drain region refers to a source region, a drain region, or a combination of a source region and a drain region, depending on the context. The source/drain regions 308 and 310 may be source/drain regions of one or more transistors of the one or more semiconductor devices 216.

The source/drain regions 308 and 310 include silicon (Si) with one or more dopants, such as a p-type material (e.g., boron (B) or germanium (Ge), among other examples), an n-type material (e.g., phosphorous (P) or arsenic (As), among other examples), and/or another type of dopant. For example, the source/drain region 308 may be included in an n-well 304 and may be referred to as an n-type source/drain region in that the source/drain region 308 is doped with one or more n-type dopants. As another example, the source/drain region 310 may be included in a p-well 302 and may be referred to as a p-type source/drain region in that the source/drain region 310 is doped with one or more p-type dopants.

A shallow trench isolation (STI) region 312 may be included between the source/drain regions 308 and 310 to provide electrical isolation between the source/drain regions 308 and 310. The STI region 312 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI region 312 may include a multi-layer structure, for example, having one or more liner layers.

As further shown in FIG. 3A, a sidewall spacer 314 may be included around the BTSV structure 238 between the BTSV structure 238 and the p-well 302. Moreover, the sidewall spacer 314 may be included between the BTSV structure 238 and the silicon substrate of the device region 212. Moreover, the sidewall spacer 314 may be included between the BTSV structure 238 and the buffer oxide layer 240. Moreover, the sidewall spacer 314 may be included between the BTSV structure 238 and the high-k dielectric layer 242. The sidewall spacer 314 may include one or more dielectric materials such as silicon oxide ($SiO_x$, such as $SiO_2$), silicon nitride ($Si_xN_y$), and/or silicon oxynitride (SiON), among other examples.

The BTSV structure 238 may extend through the p-well 302 and not through the n-well 304. Moreover, the BTSV structure 238 does not extend through any other n-wells, which would otherwise result in direct current leakage between the BTSV structure 238 and the other n-wells. A distance (D1) between the sidewall of the BTSV structure 238 and the edge of the edge of the p-well 302 next to the n-well 304 may be referred to as a keep-out zone (KOZ). The KOZ may be a design rule that prohibits the placement of the BTSV structure 238 closer to the edge of the p-well 302 next to the n-well 304. As indicated above, dangling bonds that are formed during etching of a recess in which as BTSV structure 238 is formed may act as charge trapping states, which may cause trap-assist tunnels to form in the silicon substrate of the device region 212. The trap-assist tunnels may result in electron current leakage from the p-well 302 to the n-well 304 via the BTSV structure 238. Accordingly, the distance (D1) may be selected to reduce the likelihood of and/or prevent current leakage from the BTSV structure 238.

The negative charge polarity of the high-k dielectric layer 242 provides a coupling voltage to modify the electric potential in the silicon substrate of the device region 212. In particular, the electron charge carriers in high-k dielectric layer 242 attracts hole charge carriers in the silicon substrate of the device region 212, which suppresses trap-assist tunnels that result from surface defects formed during etching of the recess for the BTSV structure 238. This enables the distance (D1) to be reduced, and enables the BTSV structure 238 to be placed closer to the edge of the p-well 302 (e.g., the edge of the p-well 302 that is interfaced with and/or next to the edge of the n-well 304) without increasing the likelihood of and/or magnitude of current leakage in the one or more semiconductor devices. In some implementations, the distance (D1) is included in a range of approximately 0.2 microns to approximately 2 microns as a result of the inclusion of the negative charge polarity of the high-k dielectric layer 242, whereas the distance (D1) might otherwise be included in a range of approximately 0.5 microns to approximately 50 microns. However, other values for these ranges are within the scope of the present disclosure.

FIG. 3B illustrates a cross-section view along line A-A in FIG. 3A (e.g., looking downward from a top view along the cross-section. As shown in FIG. 3B, the sidewall spacer 314 may surround BTSV structure 238 such that the BTSV structure 238 is not in direct contact with the p-well 302 (and thus, the silicon substrate of the device region 212). The BTSV structure 238 being in direct contact with the p-well 302 might otherwise cause current leakage and/or copper migration into the silicon substrate, and/or delamination of the BTSV structure 238 from the silicon substrate, among other examples.

As indicated above, FIGS. 3A and 3B are provided as an example. Other examples may differ from what is described with regard to FIGS. 3A and 3B.

Figure 4:
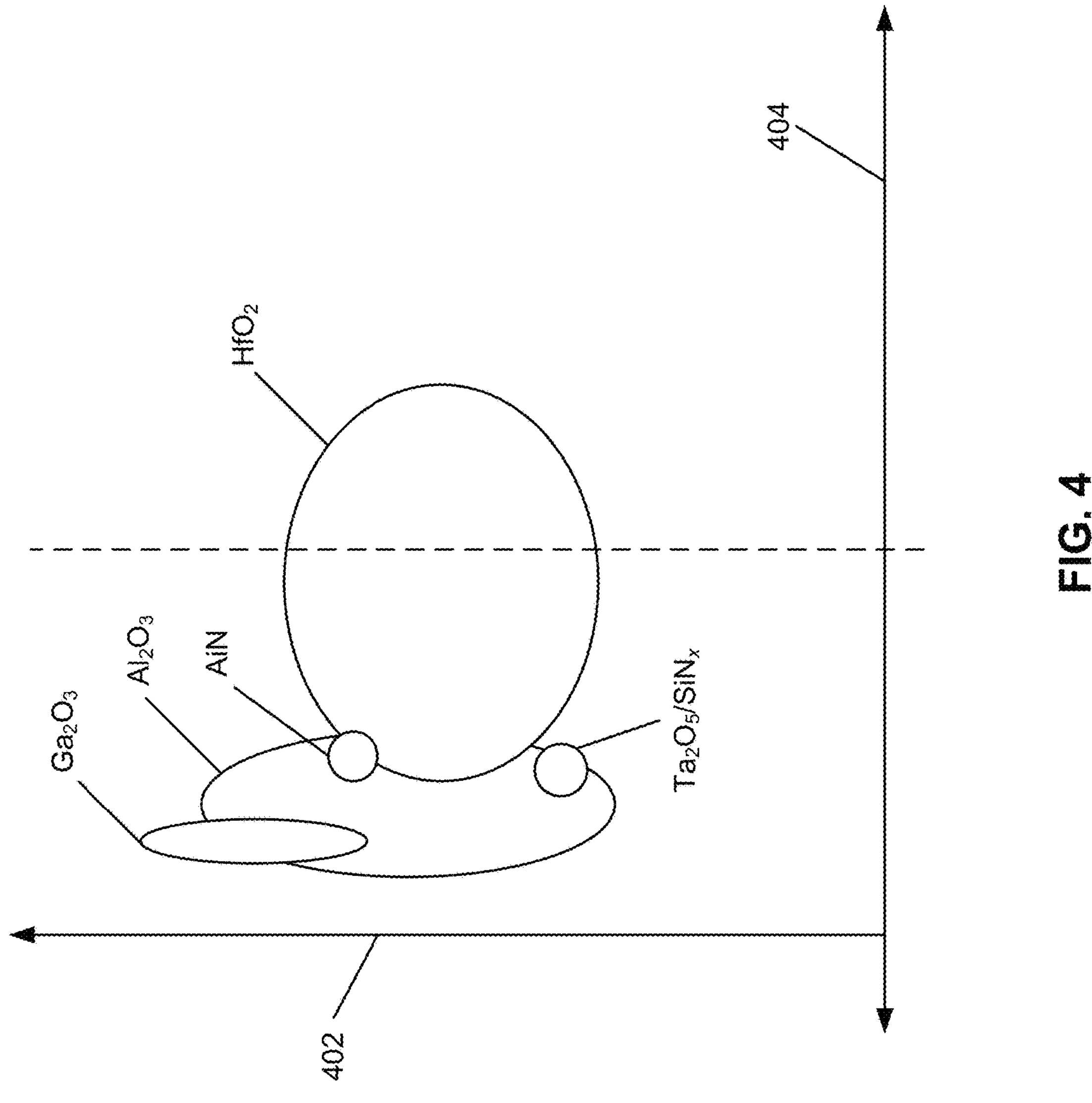
FIG. 4 is a diagram of an example implementation of charge polarities of various high dielectric constant (high-k) dielectric materials described herein.

FIG. 4 is a diagram of an example implementation 400 of charge polarities of various high-k dielectric materials described herein. One or more of the high-k dielectric materials may be included in the high-k dielectric layer 242 described herein.

The charge polarities are illustrated in the example implementation 400 as a function of interface state density ($D_{it}$) 402 in electron volts per square centimeter ($eV^{-1}/cm^2$) and fixed charge density ($Q_f/q$) 404 in $cm^2$. As shown in FIG. 4, high-k dielectric materials such as hafnium oxide ($HfO_2$), aluminum oxide ($Al_2O_3$), tantalum oxide ($Ta_2O_5$), aluminum nitride (AiN), and gallium oxide ($Ga_2O_3$) have a negative fixed charge density 404 (or a primarily negative fixed charge density 404 in the case of hafnium oxide) across the spectrum of interface state densities for these high-k dielectric materials. Other high-k dielectric materials such as titanium oxide ($TiO_2$) and niobium oxide ($Nb_2O_5$) also have a negative fixed charge density 404 across the spectrum of interface state densities for these high-k dielectric materials.

As indicated above, FIG. 4 is provided as an example. Other examples may differ from what is described with regard to FIG. 4.

Figure 5:
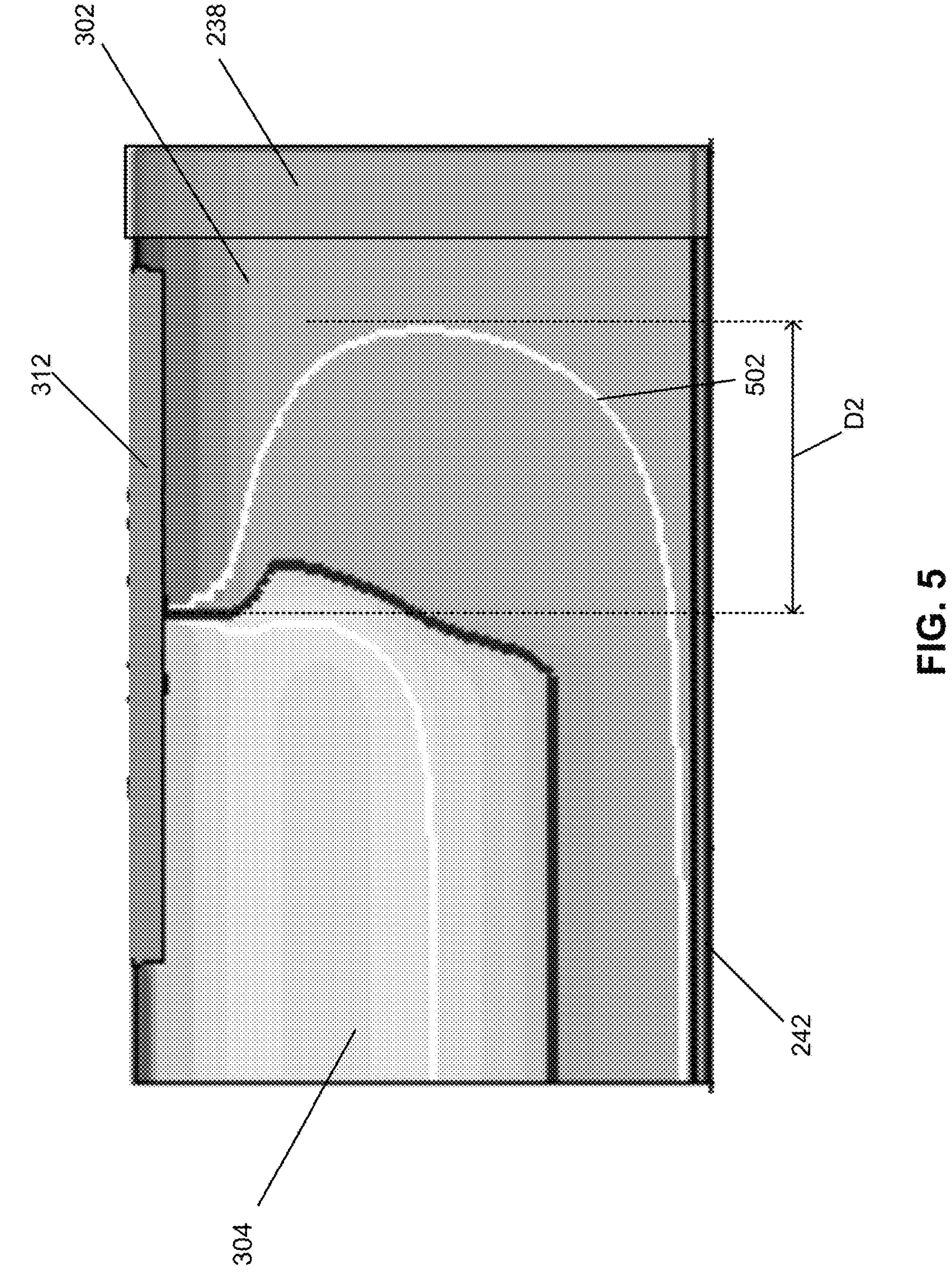
FIG. 5 is a diagram of an example implementation of a depletion edge described herein.

FIG. 5 is a diagram of an example implementation 500 of a depletion edge 502 described herein. The depletion edge 502 may occur in the p-well 302 in the silicon substrate in the device region 212 of the second semiconductor die 204 described herein.

The depletion edge 502 represents the boundary of a depletion region in the p-well 302. Inside the depletion region (e.g., the area in the p-well 302 between the edge of the n-well 304 and the depletion edge 502), a built-in electric field results in the majority of carriers to be depleted. If the depletion edge touches the BTSV structure 238, the built-in electric field may easily result in the creation of a current leakage path through the dangling bonds at the sidewalls of the BTSV structure 238.

Since the high-k dielectric layer 242 has an intrinsic negative charge polarity, the negative/electron charge carriers in the high-k dielectric layer 242 is able to attract hole charge carriers in the p-well 302, which suppresses the depletion region and reduces a depletion width (D2) of the depletion region. This causes the depletion edge 502 to curl away from the BTSV structure 238, as opposed to the depletion edge 502 progressing toward the BTSV structure 238 (which would otherwise result in current leakage). In some implementations, the intrinsic negative charge polarity of the high-k dielectric layer 242 results in the depletion width (D2) of the depletion region being less than or approximately equal to 1.22 microns. However, other values for the depletion width (D2) are within the scope of the present disclosure.

As indicated above, FIG. 5 is provided as an example. Other examples may differ from what is described with regard to FIG. 5.

FIGS. 6A-6E are diagrams of an example implementation 600 of forming a semiconductor die described herein. In some implementations, the example implementation 600 includes an example process (or a portion thereof) for forming the second semiconductor die 204. While the operations described in connection with FIGS. 6A-6E are described in connection with the second semiconductor die 204, similar operations may be performed to form the first semiconductor die 202.

Figure 6A:
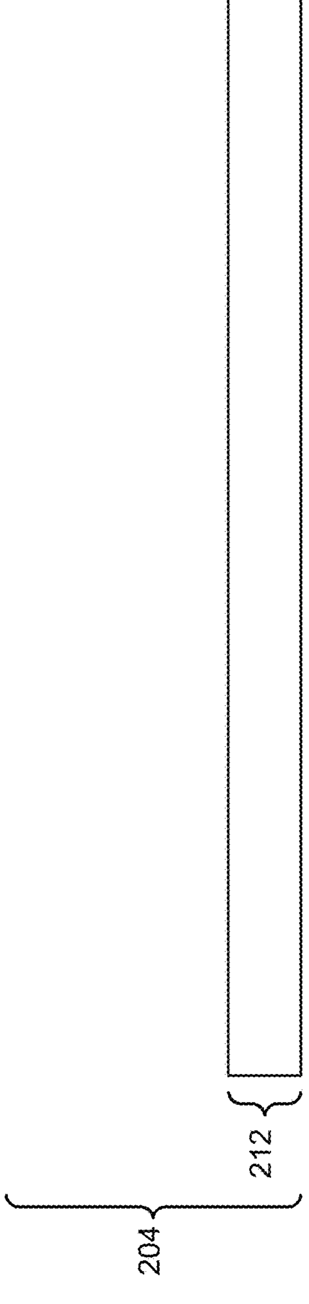
FIGS. 6A-6E are diagrams of an example implementation of forming a semiconductor die described herein.
Figure 6A:

In some implementations, one or more operations described in connection with FIGS. 6A-6E may be performed by one or more of the semiconductor processing tools 102-114 and/or the wafer/die transport tool 116. In some implementations, one or more operations described in connection with FIGS. 6A-6E may be performed by another semiconductor processing tool. Turning to FIG. 6A, one or more of the operations in the example implementation 600 may be performed in connection with the silicon substrate of the device region 212 of the second semiconductor die 204.

Figure 6B:
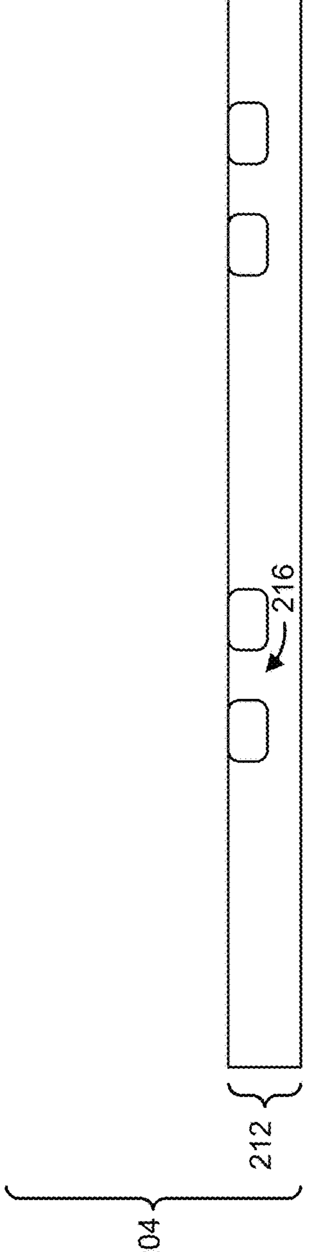

As shown in FIG. 6B, one or more semiconductor devices 216 may be formed in the device region 212. For example, one or more of the semiconductor processing tools 102-114 may perform photolithography patterning operations, etching operations, deposition operations, CMP operations, and/or another type of operations to form one or more transistors, one or more capacitors, one or more memory cells, and/or one or more semiconductor devices of another type. In some implementations, one or more regions of the silicon substrate of the device region 212 may be doped in an ion implantation operation to form one or more p-wells 302, one or more n-wells 304, and/or one or more deep n-wells 306. In some implementations, the deposition tool 102 may deposit one or more source/drain regions 308, one or more source/drain regions 310, and/or one or more STI regions 312, among other examples.

Figure 6C:
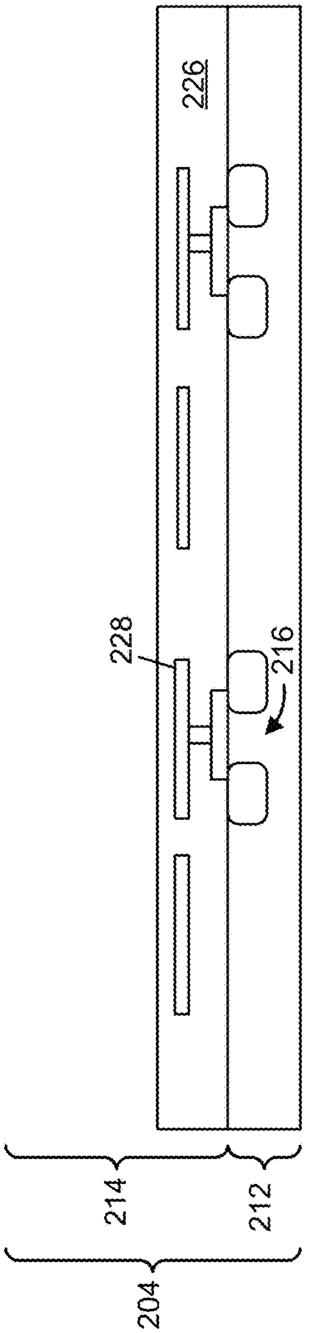
Figure 6D:
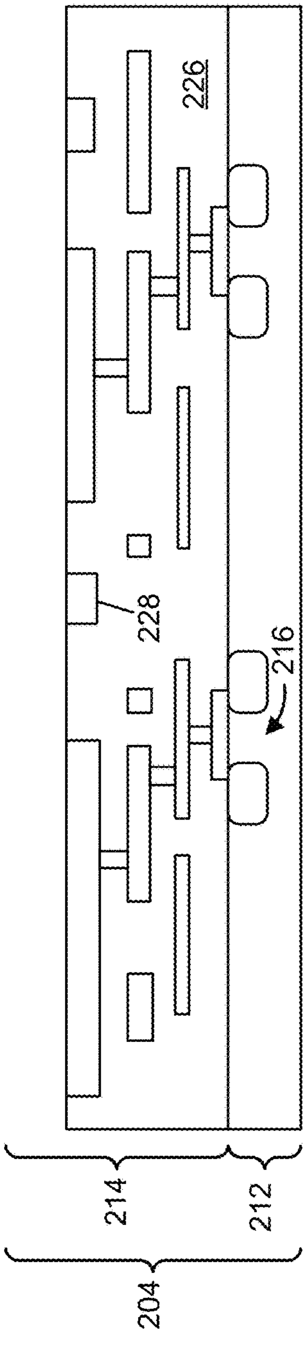
Figure 6D:
Figure 6E:
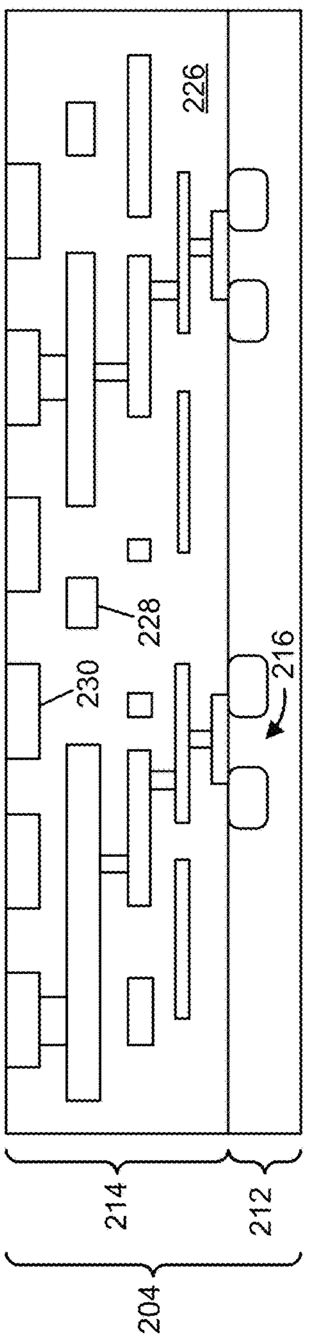
Figure 6E:

As shown in FIGS. 6C-6E, the interconnect region 214 of the second semiconductor die 204 may be formed over and/or on the silicon substrate of the device region 212. One or more of the semiconductor processing tools 102-114 may form the interconnect region 214 by forming one or more dielectric layers 226 and forming a plurality of metallization layers 228 in the plurality of dielectric layers 226. For example, the deposition tool 102 may deposit a first layer of the one or more dielectric layers 226 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 228 in the recesses (e.g., using a CVD technique, an ALD technique, a PVD technique, an electroplating technique, and/or another type of deposition technique). At least a portion of the first metallization layer may be electrically connected and/or physically connected with the semiconductor device(s) 216. The deposition tool 102, the etch tool 108, the plating tool 112, and/or another semiconductor processing tool may continue to perform similar processing operations to forming the interconnect region 214 until a sufficient or desired arrangement of metallization layers 228 is achieved.

As shown in FIG. 6E, one or more of the semiconductor processing tools 102-114 may form another layer of the one or more dielectric layers 226, and may form a plurality of contacts 230 in the layer such that the contacts 230 are electrically connected and/or physically connected with one or more of the metallization layers 228. For example, the deposition tool 102 may deposit the layer of the one or more dielectric layers 226 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 230 in the recesses (e.g., using a CVD technique, an ALD technique, a PVD technique, an electroplating technique, and/or another type of deposition technique).

As indicated above, FIGS. 6A-6E are provided as an example. Other examples may differ from what is described with regard to FIGS. 6A-6E.

FIGS. 7A-7D are diagrams of an example implementation 700 of forming a portion of a semiconductor die package 200 described herein. In some implementations, one or more operations described in connection with FIGS. 7A-7D may be performed by one or more of the semiconductor processing tools 102-114 and/or the wafer/die transport tool 116. In some implementations, one or more operations described in connection with FIGS. 7A-7D may be performed by another semiconductor processing tool.

Figure 7A:
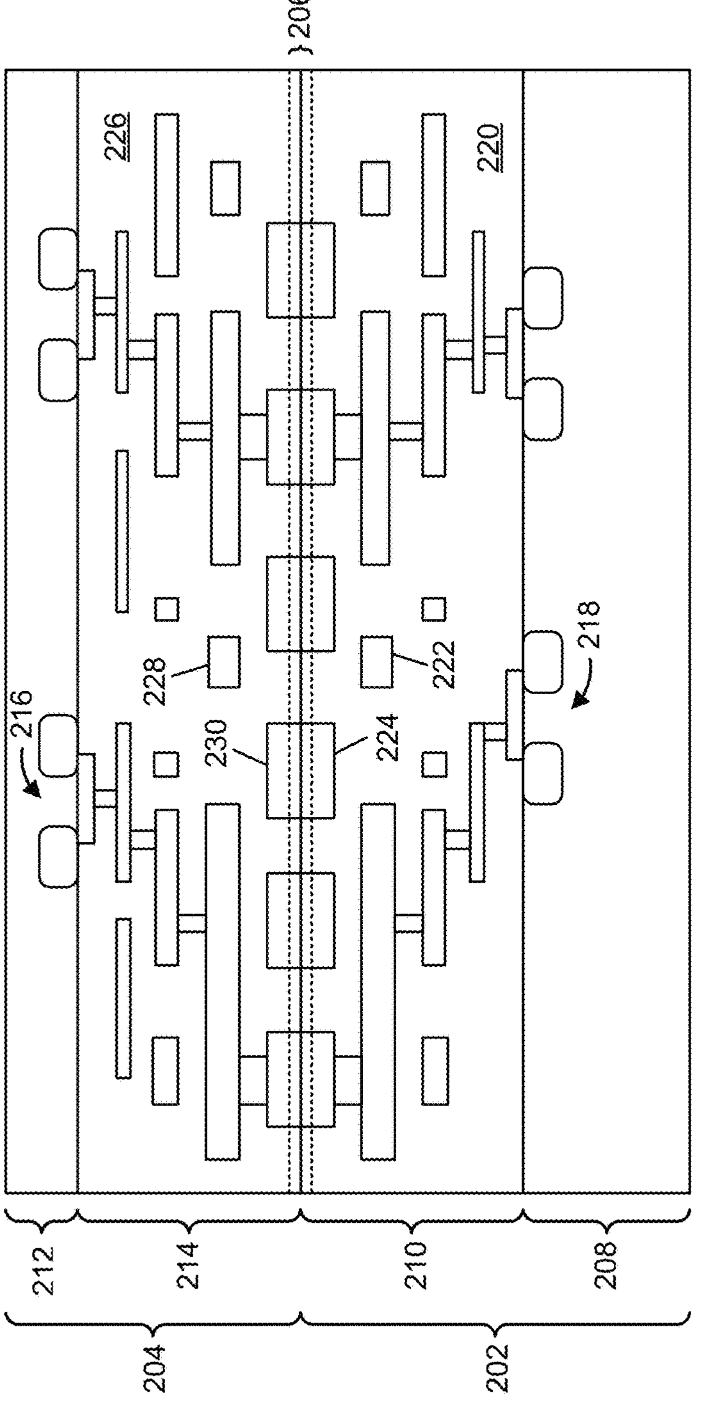
FIGS. 7A-7D are diagrams of an example implementation of forming a portion of a semiconductor die package described herein.

As shown in FIG. 7A, the first semiconductor die 202 and the second semiconductor die 204 may be bonded at the bonding interface 206 such that the first semiconductor die 202 and the second semiconductor die 204 are vertically arranged or stacked in a WoW configuration. The bonding tool 114 may perform a bonding operation to bond the first semiconductor die 202 and the second semiconductor die 204 at the bonding interface 206. The bonding operation may include a direct bonding operation (or hybrid bonding operation) in which bonding of first semiconductor die 202 and the second semiconductor die 204 is achieved through the physical connection of the contacts 224 with the contacts 230.

Figure 7B:
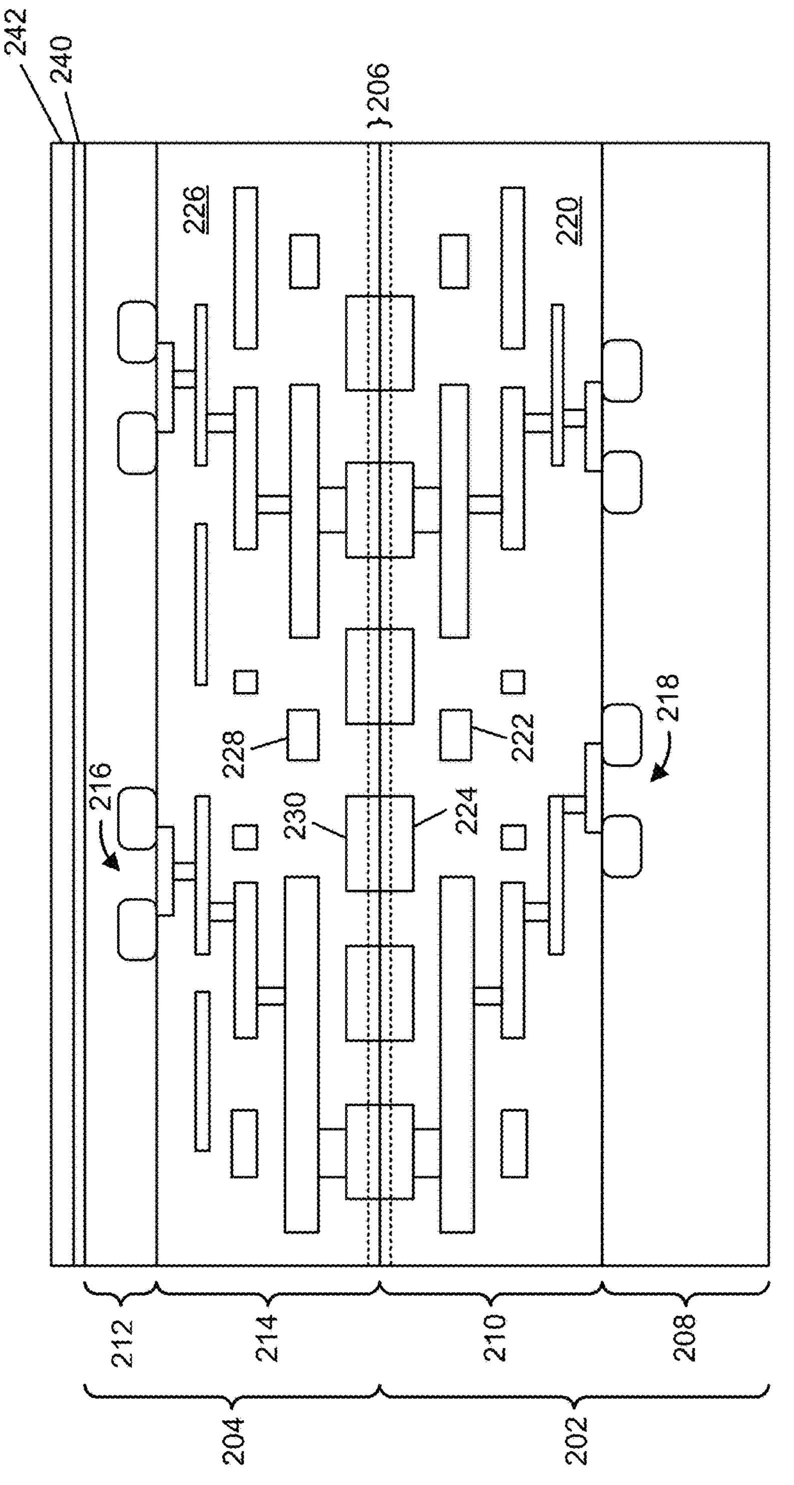

As shown in FIG. 7B, the buffer oxide layer 240 may be formed on the second semiconductor die 204. The second semiconductor die 204 may be bonded with the first semiconductor die 202 at a first side of the second semiconductor die 204, which may correspond to a first side of the interconnect region 214. The buffer oxide layer 240 may be formed on a second side of the second semiconductor die 204 opposing the first side, which may correspond to a first side of the device region 212 of the second semiconductor die 204. The deposition tool 102 may deposit the buffer oxide layer 240 using an epitaxy technique, a CVD technique, a PVD technique, an ALD technique, another deposition technique described above in connection with FIG. 1, and/or a deposition technique other than as described above in connection with FIG. 1.

As further shown in FIG. 7B, the high-k dielectric layer 242 may be formed over the second semiconductor die 204. The high-k dielectric layer 242 may be formed over the second side of the second semiconductor die 204 opposing the first side, which may correspond to the first side of the device region 212 of the second semiconductor die 204. The high-k dielectric layer 242 may be formed on the buffer oxide layer 240. The deposition tool 102 may deposit the buffer oxide layer 240 using an epitaxy technique, a CVD technique, a PVD technique, an ALD technique, another deposition technique described above in connection with FIG. 1, and/or a deposition technique other than as described above in connection with FIG. 1. The high-k dielectric layer 242 may be deposited at a temperature that is included in a range of approximately 150 degrees Celsius to approximately 300 degrees Celsius. However, other values for the range are within the scope of the present disclosure.

As described above the high-k dielectric layer 242 may have an intrinsic negative polarity. Accordingly, forming the high-k dielectric layer 242 may include depositing one or more materials having an intrinsic negative charge polarity to form the high-k dielectric layer 242. The intrinsic negative charge polarity results from lattice defects, in the one or more materials, that form during deposition of the one or more materials.

Figure 7C:
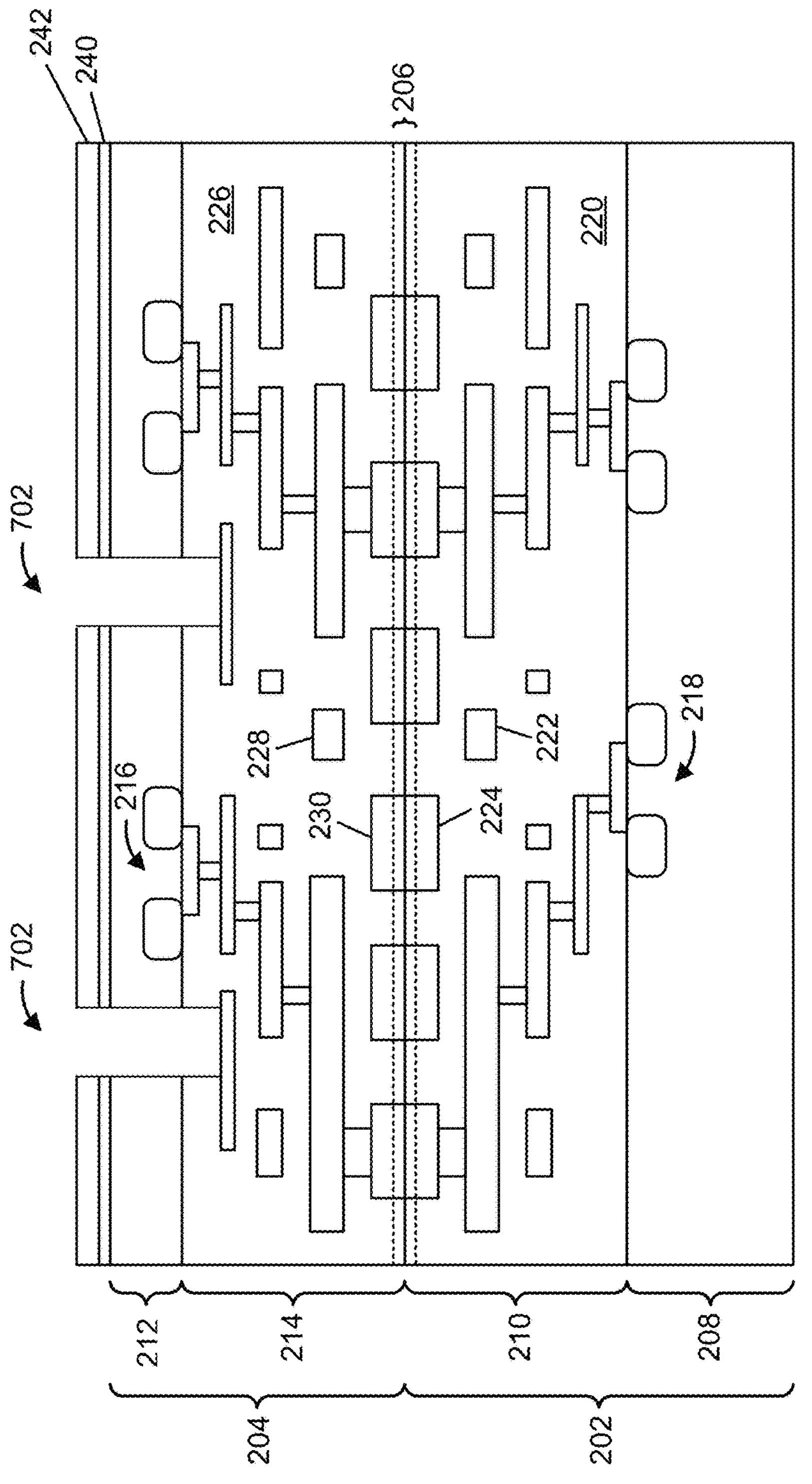

As shown in FIG. 7C, one or more recesses 702 may be formed through the high-k dielectric layer 242, through the buffer oxide layer 240, through the silicon substrate of the device region 212, and into a portion of the dielectric layer 226 of the interconnect region 214. The one or more recesses 702 may be formed to expose one or more portions of a metallization layer 228 in the interconnection region 214. Thus, the one or more recesses 702 may be formed over the one or more portions of a metallization layer 228.

In some implementations, a pattern in a photoresist layer is used to form the one or more recesses 702. In these implementations, the deposition tool 102 forms the photoresist layer on the high-k dielectric layer 242. The exposure tool 104 exposes the photoresist layer to a radiation source to pattern the photoresist layer. The developer tool 106 develops and removes portions of the photoresist layer to expose the pattern. The etch tool 108 etches through the high-k dielectric layer 242, through the buffer oxide layer 240, through the device region 212, and into the interconnect region 214 to form the one or more recesses 702. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the one or more recesses 702 based on a pattern.

Figure 7D:
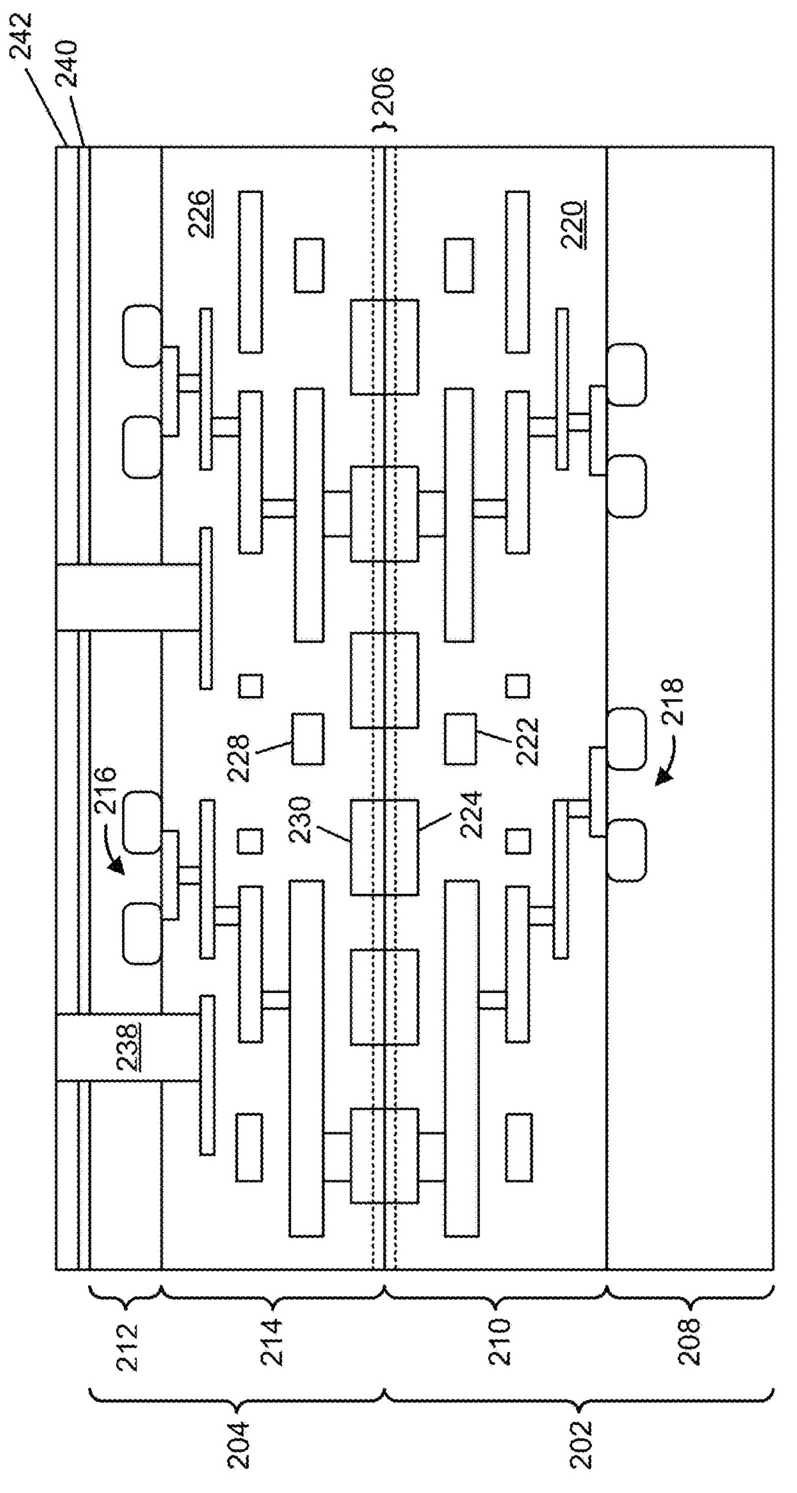

As shown in FIG. 7D, one or more BTSV structures 238 may be formed in the one or more recesses 702. In this way, the one or more BTSV structures 238 extend through the high-k dielectric layer 242, through the buffer oxide layer 240, through the device region 212, and into the interconnect region 214. Moreover, one or more BTSV structures 238 may be formed adjacent to one or more semiconductor devices 216 in the device region 212, and may be formed through one or more p-wells 302 (e.g., p-wells 302 that are associated with one or more semiconductor devices 216) in the silicon substrate of the device region 212. The one or more BTSV structures 238 may be electrically connected and/or physically connected with the one or more portions of the metallization layer 228 that were exposed through the one or more recesses 702.

The deposition tool 102 and/or the plating tool 112 may deposit the one or more BTSV structures 238 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the one or more BTSV structures 238 after the one or more BTSV structures 238 are deposited.

As indicated above, FIGS. 7A-7D are provided as an example. Other examples may differ from what is described with regard to FIGS. 7A-7D.

FIGS. 8A-8D are diagrams of an example implementation 800 of forming a portion of a semiconductor die package 200 described herein. In some implementations, one or more operations described in connection with FIGS. 8A-8D may be performed after one or more operations described in connection with FIGS. 7A-7D. In some implementations, one or more operations described in connection with FIGS. 8A-8D may be performed by one or more of the semiconductor processing tools 102-114 and/or the wafer/die transport tool 116. In some implementations, one or more operations described in connection with FIGS. 8A-8D may be performed by another semiconductor processing tool.

Figure 8A:
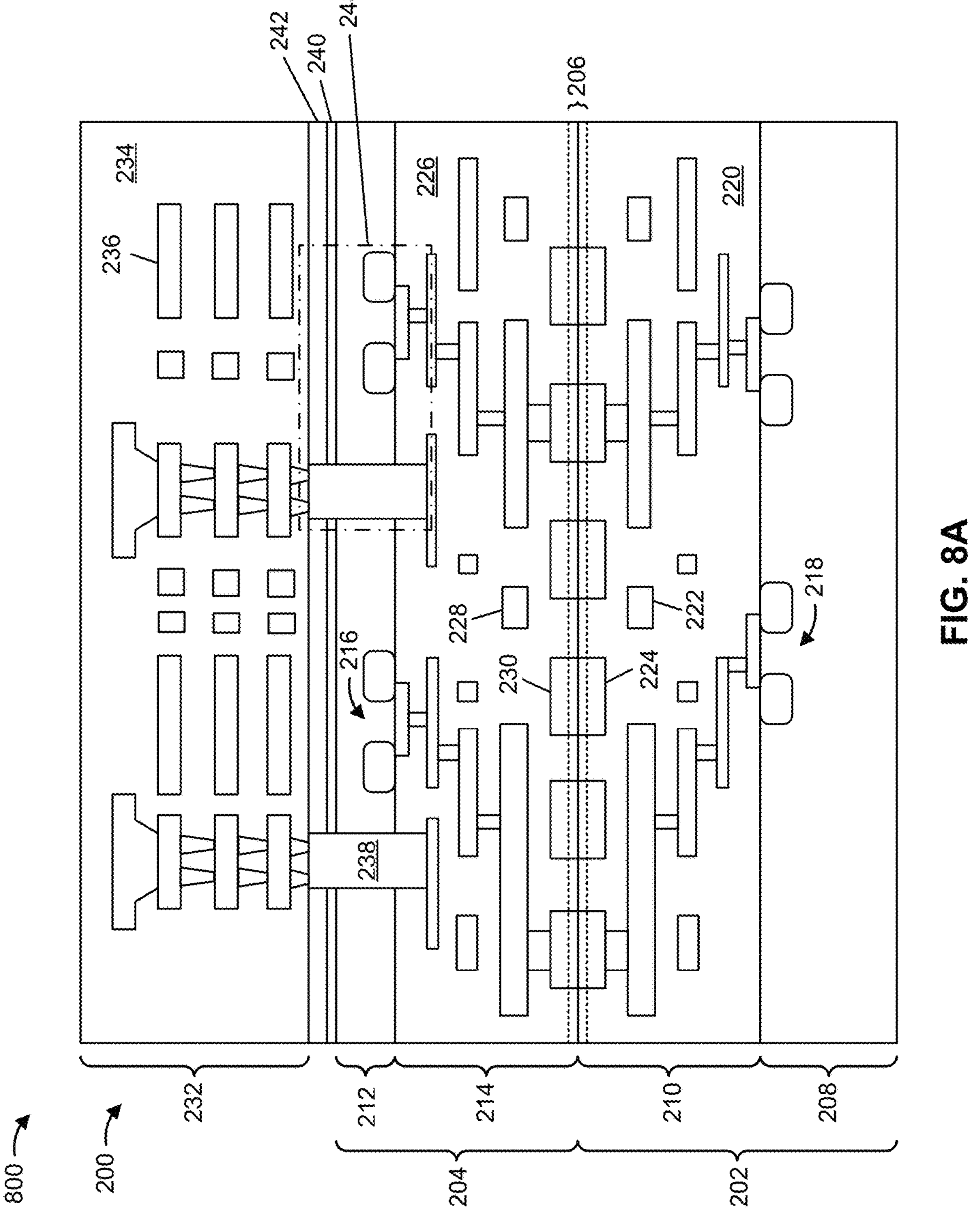
FIGS. 8A-8D are diagrams of an example implementation of forming a portion of a semiconductor die package described herein.

As shown in FIG. 8A, the redistribution structure 232 of the semiconductor die package 200 may be formed over the second semiconductor die 204. One or more of the semiconductor processing tools 102-114 may form the redistribution structure 232 by forming one or more dielectric layers 234 and forming a plurality of metallization layers 236 in the plurality of dielectric layers 234. For example, the deposition tool 102 may deposit a first layer of the one or more dielectric layers 234 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 236 in the recesses (e.g., using a CVD technique, an ALD technique, a PVD technique, an electroplating technique, and/or another type of deposition technique). At least a portion of the first metallization layer may be electrically connected and/or physically connected with the one or more BTSV structures 238. The deposition tool 102, the etch tool 108, the plating tool 112, and/or another semiconductor processing tool may continue to perform similar processing operations to forming the redistribution structure 232 until a sufficient or desired arrangement of metallization layers 236 is achieved.

Figure 8B:
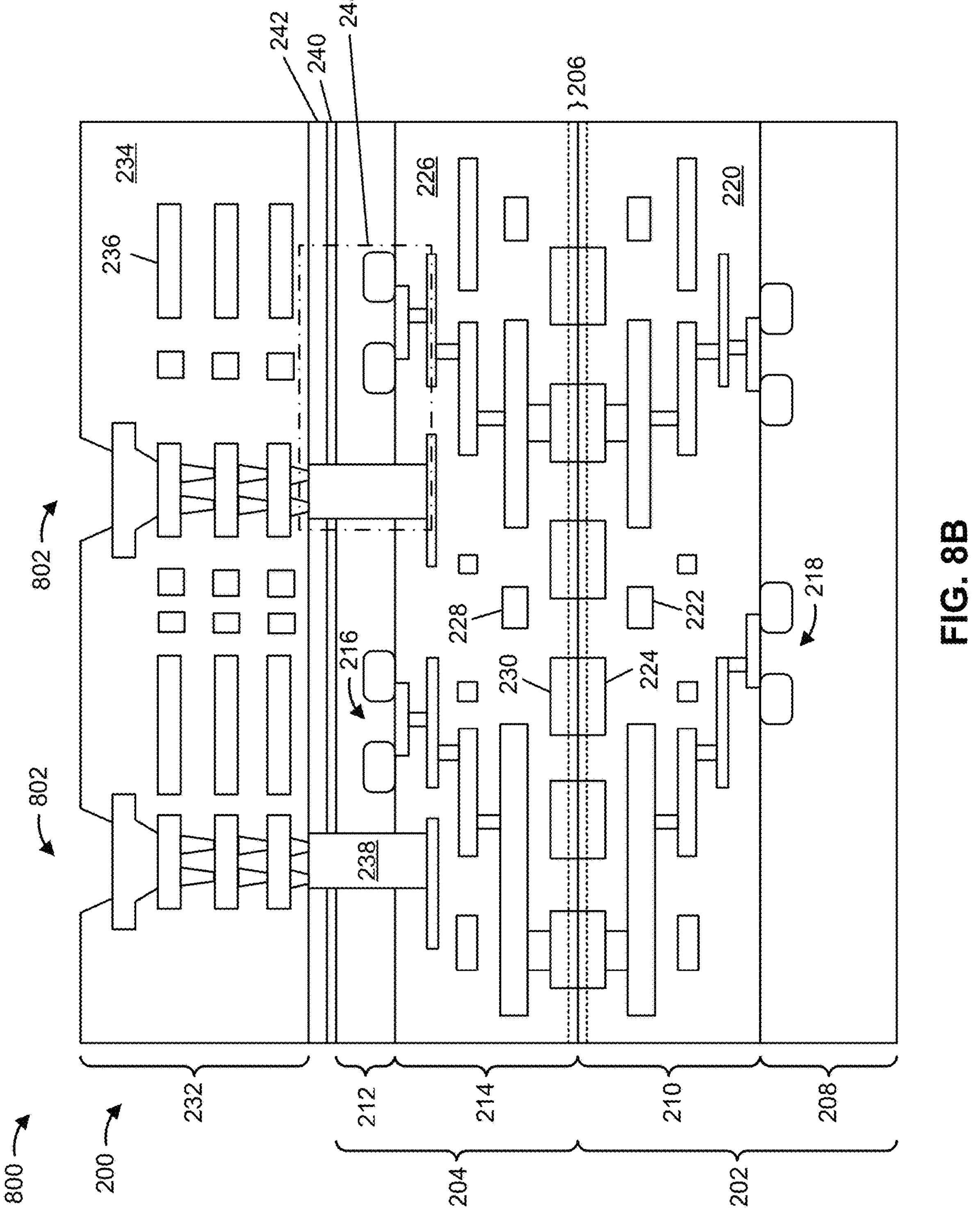

As shown in FIG. 8B, recesses 802 may be formed in the one or more dielectric layers 234. The recesses 802 may be formed to expose portions of a metallization layer 236 in the redistribution structure 232. Thus, the recesses 802 may be formed over the one or more portions of a metallization layer 236.

In some implementations, a pattern in a photoresist layer is used to form the recesses 802. In these implementations, the deposition tool 102 forms the photoresist layer on the one or more dielectric layers 234. The exposure tool 104 exposes the photoresist layer to a radiation source to pattern the photoresist layer. The developer tool 106 develops and removes portions of the photoresist layer to expose the pattern. The etch tool 108 etches into the one or more dielectric layers 234 to form the recesses 802. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 802 based on a pattern.

Figure 8C:
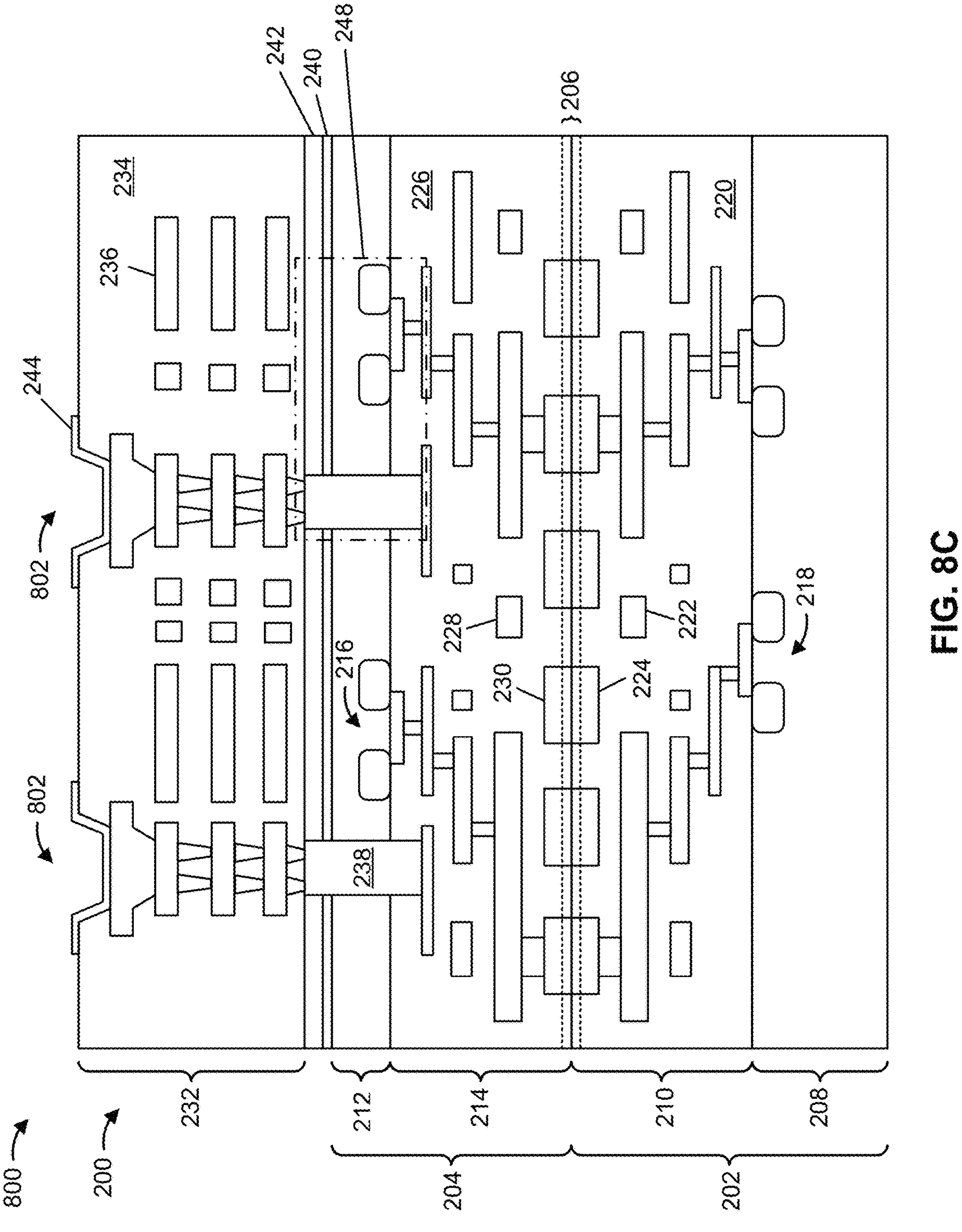

As shown in FIG. 8C, UBM layers 244 may be formed in the recesses 802. The deposition tool 102 and/or the plating tool 112 may deposit the UBM layers 244 using a CVD technique, a PVD technique, an ALD technique, an electroplating technique, another deposition technique described above in connection with FIG. 1, and/or a deposition technique other than as described above in connection with FIG. 1. In some implementations, a continuous layer of conductive material is deposited on the top surface of the redistribution structure 232, including in the recess 802. The continuous layer of conductive material is then patterned (e.g., by the deposition tool 102, the exposure tool 104, and the developer tool 106) to form a pattern on the continuous layer of the conductive material, and the etch tool 108 removes portions of the continuous layer of the conductive material based on the pattern. Remaining portions of the continuous layer of the conductive material may correspond to the UBM layers 244.

Figure 8D:
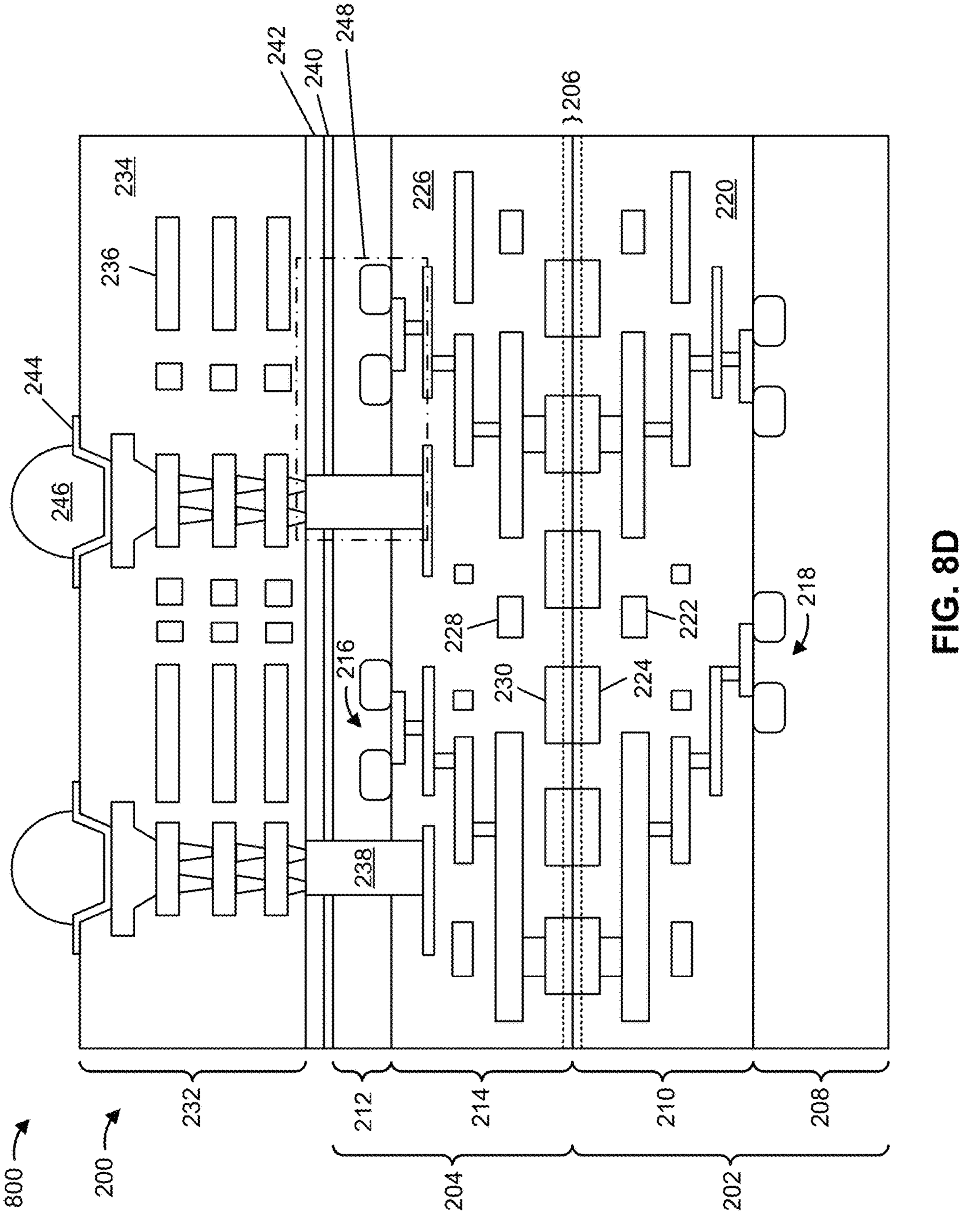

As shown in FIG. 8D, conductive terminals 246 may be formed in the recesses 802 over the UBM layers 244. In some implementations, the plating tool 112 forms the conductive terminals 246 using an electroplating technique. In some implementations, solder is dispensed in the recesses 802 to form the conductive terminals 246.

As indicated above, FIGS. 8A-8D are provided as an example. Other examples may differ from what is described with regard to FIGS. 8A-8D.

Figure 9:
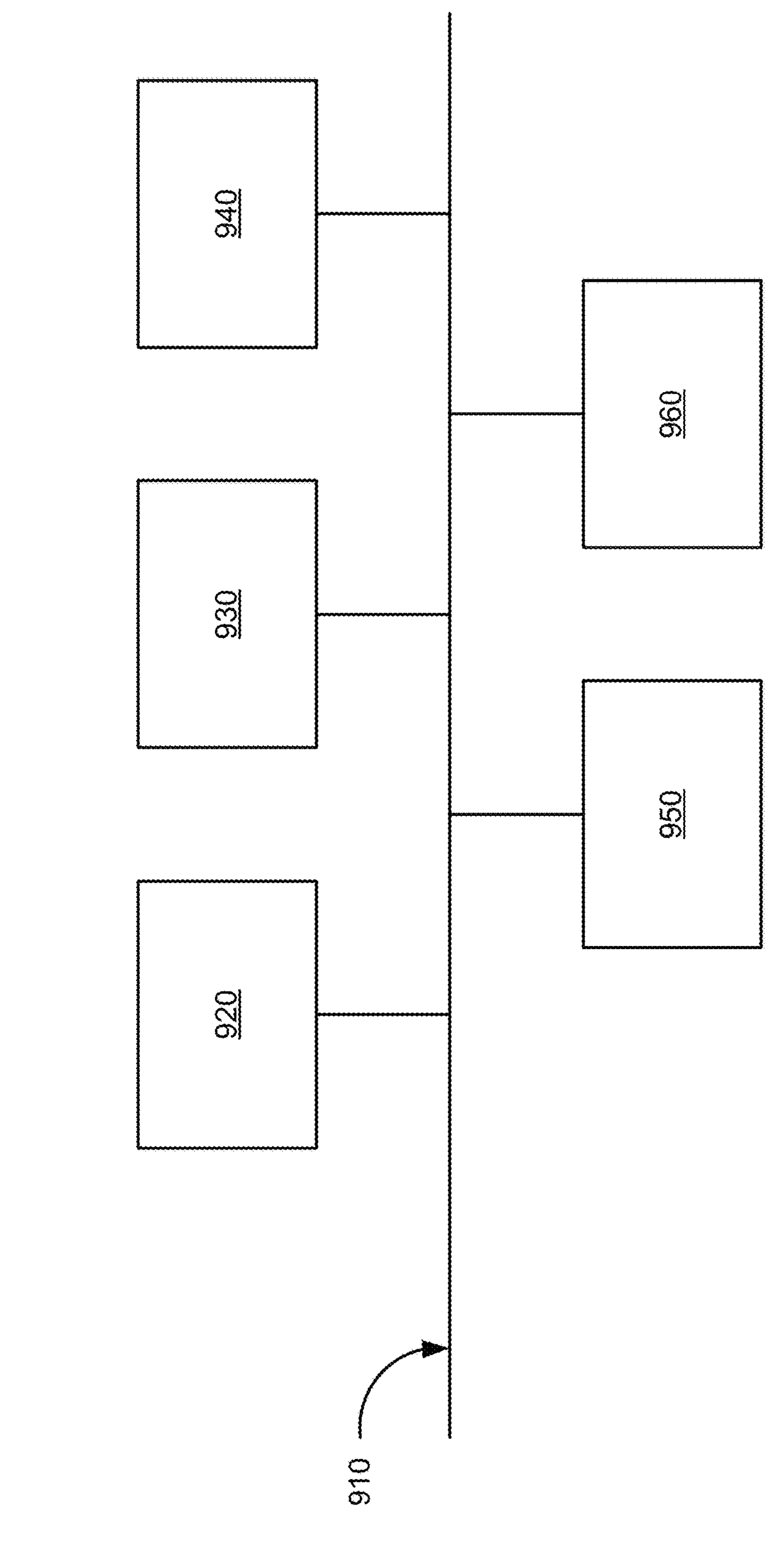
FIG. 9 is a diagram of example components of a device described herein.

FIG. 9 is a diagram of example components of a device 900 described herein. In some implementations, one or more of the semiconductor processing tools 102-114 and/or the wafer/die transport tool 116 may include one or more devices 900 and/or one or more components of device 900. As shown in FIG. 9, device 900 may include a bus 910, a processor 920, a memory 930, an input component 940, an output component 950, and a communication component 960.

Bus 910 may include one or more components that enable wired and/or wireless communication among the components of device 900. Bus 910 may couple together two or more components of FIG. 9, such as via operative coupling, communicative coupling, electronic coupling, and/or electric coupling. Processor 920 may include a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 may include one or more processors capable of being programmed to perform one or more operations or processes described elsewhere herein.

Memory 930 may include volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 may include one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
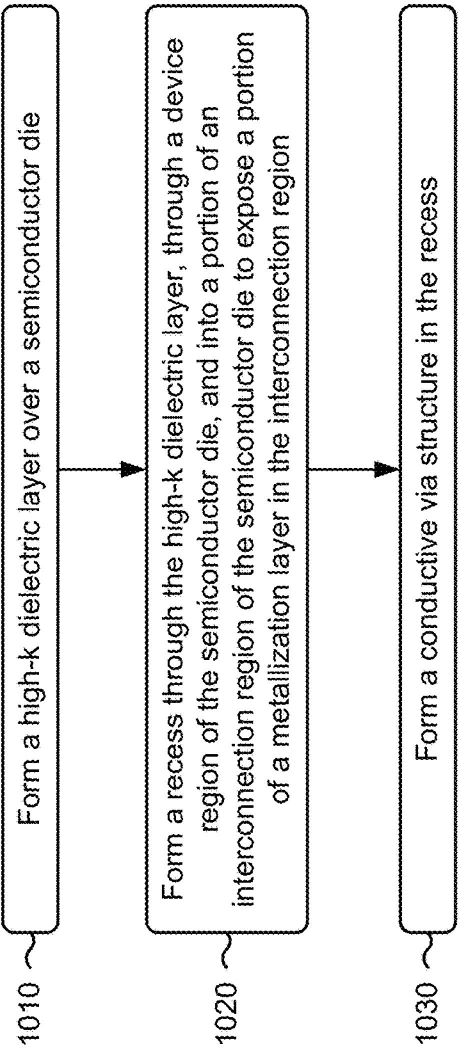
FIG. 10 is a flowchart of an example process associated with forming a semiconductor die package.

FIG. 10 is a flowchart of an example process 1000 associated with forming a semiconductor die package. In some implementations, one or more process blocks of FIG. 10 are performed by one or more semiconductor processing tools (e.g., one or more of the semiconductor processing tools 102-114). Additionally, or alternatively, one or more process blocks of FIG. 10 may be performed by one or more components of device 900, such as processor 920, memory 930, input component 940, output component 950, and/or communication component 960.

As further shown in FIG. 10, process 1000 may include forming a high-k dielectric layer over a semiconductor die (block 1010). For example, one or more of the semiconductor processing tools 102-114 may form a high-k dielectric layer 242 over the second semiconductor die 204, as described herein. In some implementations, the high-k dielectric layer 242 has a negative charge polarity. In some implementations the second semiconductor die 204 is bonded with the first semiconductor die 202 at a bonding interface 206.

As further shown in FIG. 10, process 1000 may include forming a recess through the high-k dielectric layer, through a device region of the semiconductor die, and into a portion of an interconnection region of the semiconductor die to expose a portion of a metallization layer in the interconnection region (block 1020). For example, one or more of the semiconductor processing tools 102-114 may form a recess 702 through the high-k dielectric layer 242, through a device region 212 of the second semiconductor die 204, and into a portion of an interconnection region 214 of the second semiconductor die 204 to expose a portion of a metallization layer 228 in the interconnection region 214, as described herein.

As further shown in FIG. 10, process 1000 may include forming a conductive via structure in the recess (block 1030). For example, one or more of the semiconductor processing tools 102-114 may form a BTSV structure 238 in the recess 702, as described herein.

Process 1000 may include additional implementations, such as any single implementation or any combination of implementations described below and/or in connection with one or more other processes described elsewhere herein.

In a first implementation, forming the BTSV structure 238 includes forming the BTSV structure 238 adjacent to one or more semiconductor devices 216 in the device region 212 of the second semiconductor die 204.

In a second implementation, alone or in combination with the first implementation, forming the BTSV structure 238 includes forming the BTSV structure 238 through a p-well 302 associated with the one or more semiconductor devices 216, where the p-well 302 is adjacent to an n-well 304 associated with the one or more semiconductor devices 216.

In a third implementation, alone or in combination with one or more of the first and second implementations, forming the high-k dielectric layer 242 includes forming the high-k dielectric layer 242 to a thickness that is in a range of approximately 20 angstroms to approximately 500 angstroms.

In a fourth implementation, alone or in combination with one or more of the first through third implementations, forming the high-k dielectric layer 242 includes depositing one or more materials having an intrinsic negative charge polarity to form the high-k dielectric layer 242.

In a fifth implementation, alone or in combination with one or more of the first through fourth implementations, the one or more materials includes at least one of a hafnium oxide ($HfO_x$), an aluminum oxide ($Al_xO_y$), a tantalum oxide ($Ta_xO_y$), a gallium oxide ($Ga_xO_y$), a titanium oxide ($TiO_x$), or a niobium oxide ($Nb_xO_y$).

In a sixth implementation, alone or in combination with one or more of the first through fifth implementations, the intrinsic negative charge polarity results from lattice defects, in the one or more materials, that form during deposition of the one or more materials.

In a seventh implementation, alone or in combination with one or more of the first through sixth implementations, process 1000 includes forming a buffer oxide layer 240 on the device region 212, where forming the high-k dielectric layer 242 includes forming the high-k dielectric layer 242 on the buffer oxide layer 240.

In an eighth implementation, alone or in combination with one or more of the first through seventh implementations, the process 1000 includes bonding the first semiconductor die 202 and the second semiconductor die 204 by performing a hybrid bonding operation to bond the first semiconductor die 202 and the second semiconductor die 204 in a WoW configuration.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

In this way, a semiconductor die package (e.g., a WoW semiconductor die package) includes a high-k dielectric layer over a device region (e.g., a silicon substrate) of a first semiconductor die that is bonded with a second semiconductor die in a WoW configuration. A TSV structure (e.g., a BTSV structure) may be formed through the device region. The high-k dielectric layer has an intrinsic negative charge polarity that provides a coupling voltage to modify the electric potential in the device region. In particular, the negative charges (e.g., electron carriers) in high-k dielectric layer attracts hole charge carriers in device region, which suppresses trap-assist tunnels that result from surface defects formed during etching of the recess for the TSV structure. Therefore, the high-k dielectric layer described herein reduces the likelihood of (and/or the magnitude of) current leakage in semiconductor devices that are included in the device region of the first semiconductor die. This may increase the performance of the semiconductor devices and/or may enable the semiconductor devices to be placed closer together and closer to the TSV structure, which enables reduced semiconductor device pitch and increased semiconductor device density in the first semiconductor die, among other examples.

As described in greater detail above, some implementations described herein provide a semiconductor die package. The semiconductor die package includes a first semiconductor die. The semiconductor die package includes a second semiconductor die, bonded with the first semiconductor die at a first side of the second semiconductor die, comprising, a device region including one or more semiconductor devices an interconnect region between the device region and the first semiconductor die. The semiconductor die package includes a dielectric layer over a second side of the second semiconductor die opposing the first side, where the dielectric layer has an intrinsic negative charge polarity. The semiconductor die package includes a conductive via structure that extends through the dielectric layer, through the device region, and into a portion of the interconnect region.

As described in greater detail above, some implementations described herein provide a method. The method includes forming a high-k dielectric layer over a semiconductor die, where the high-k dielectric layer has a negative charge polarity. The method includes forming a recess through the high-k dielectric layer, through a device region of the semiconductor die, and into a portion of an interconnection region of the semiconductor die to expose a portion of a metallization layer in the interconnection region. The method includes forming a conductive via structure in the recess.

As described in greater detail above, some implementations described herein provide a semiconductor die package. The semiconductor die package includes a first semiconductor die. The semiconductor die package includes a second semiconductor die, bonded with the first semiconductor die at a first side of the second semiconductor die, comprising, a device region including one or more semiconductor devices an interconnect region between the device region and the first semiconductor die. The semiconductor die package includes a high-k dielectric layer over a second side of the second semiconductor die opposing the first side, where the high-k dielectric layer has an intrinsic negative charge polarity. The semiconductor die package includes a TSV structure that extends through the high-k dielectric layer, through the device region, and into a portion of the interconnect region, where the TSV structure extends through a p-well that is next to an n-well in the device region. The intrinsic negative charge polarity of the high-k dielectric layer is configured to resist current leakage from the p-well to the n-well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a high dielectric constant (high-k) dielectric layer over a semiconductor die, wherein the high-k dielectric layer has a negative charge polarity;
forming a recess through the high-k dielectric layer, through a device region of the semiconductor die, and into a portion of an interconnection region of the semiconductor die to expose a portion of a metallization layer in the interconnection region; and
forming a through silicon via (TSV) conductive via structure in the recess, adjacent to one or more semiconductor devices in the device region of the semiconductor die, through a p-well associated with the one or more semiconductor devices,
wherein the p-well is adjacent to an n-well associated with the one or more semiconductor devices.

2. The method of claim 1,
wherein
the TSV is a backside through silicon via (BTSV).

3. The method of claim 1,
wherein forming the high-k dielectric layer comprises:
forming the high-k dielectric layer to a thickness that is in a range of approximately 20 angstroms to approximately 500 angstroms.

4. The method of claim 1,
wherein forming the high-k dielectric layer comprises:
depositing one or more materials having an intrinsic negative charge polarity to form the high-k dielectric layer.

5. The method of claim 4,
wherein the one or more materials comprise at least one of:
a hafnium oxide ($HfO_x$),
an aluminum oxide ($Al_xO_y$),
a tantalum oxide ($Ta_xO_y$),
a gallium oxide ($Ga_xO_y$),
a titanium oxide ($TiO_x$), or
a niobium oxide ($Nb_xO_y$).

6. The method of claim 4,
wherein the intrinsic negative charge polarity results from lattice defects, in the one or more materials, that form during deposition of the one or more materials.

7. The method of claim 1, further comprising:
forming a buffer oxide layer over the device region,
wherein forming the high-k dielectric layer comprises:
forming the high-k dielectric layer over the buffer oxide layer.

8. The method of claim 1, further comprising:
performing a hybrid bonding operation to bond the semiconductor die and another semiconductor die in a wafer on wafer (WoW) configuration.

9. A method, comprising:
forming a first semiconductor die;
forming a second semiconductor die, bonded with the first semiconductor die at a first side of the second semiconductor die, the second semiconductor die comprising:
a device region including one or more semiconductor devices; and
an interconnect region between the device region and the first semiconductor die;
forming a dielectric layer over a second side of the second semiconductor die opposing the first side, wherein the dielectric layer has an intrinsic negative charge polarity; and
forming a conductive via structure that extends through the dielectric layer, through the device region, and into a portion of the interconnect region,
wherein the conductive via structure is a through silicon via (TSV) structure that extends through a p-well in the device region and not through an n-well in the device region.

10. The method of claim 9,
wherein a distance between a sidewall of the TSV structure and an edge of the p-well is included in a range of approximately 0.2 microns to approximately 2 microns.

11. The method of claim 9,
wherein the dielectric layer is configured to facilitate attraction of hole charge carriers in the device region toward electron charge carriers in the dielectric layer.

12. The method of claim 9,
wherein a thickness of the dielectric layer is in a range of approximately 20 angstroms to approximately 500 angstroms.

13. The method of claim 9,
wherein the dielectric layer comprises at least one of:
a hafnium oxide ($HfO_x$),
an aluminum oxide ($Al_xO_y$),
a tantalum oxide ($Ta_xO_y$),
a gallium oxide ($Ga_xO_y$),
a titanium oxide ($TiO_x$), or
a niobium oxide ($Nb_xO_y$).

14. The method of claim 9, further comprising:
forming a buffer oxide layer between the second semiconductor die and the dielectric layer,
wherein the conductive via extends through the buffer oxide layer.

15. A method, comprising:

forming a first semiconductor die; and forming a second semiconductor die, bonded with the first semiconductor die at a first side of the second semiconductor die, the second semiconductor die comprising:

a device region including one or more semiconductor devices; and an interconnect region between the device region and the first semiconductor die;

forming a high dielectric constant (high-k) dielectric layer over a second side of the second semiconductor die opposing the first side, wherein the high-k dielectric layer has an intrinsic negative charge polarity; and forming a through silicon via (TSV) structure that extends through the high-k dielectric layer, through the device region, and into a portion of the interconnect region, wherein the TSV structure extends through a p-well that is next to an n-well in the device region, and wherein the intrinsic negative charge polarity of the high-k dielectric layer is configured to resist current leakage from the p-well to the n-well.

16. The method of claim 9, wherein the TSV is a backside through silicon via (BTSV).

17. The method of claim 9, wherein the dielectric layer is a high dielectric constant (high-k) dielectric layer.

18. The method of claim 15, wherein the high-k dielectric layer comprises at least one of:

a hafnium oxide ($HfO_x$), an aluminum oxide ($Al_xO_y$), a tantalum oxide ($Ta_xO_y$), a gallium oxide ($Ga_xO_y$), a titanium oxide ($TiO_x$), or a niobium oxide ($Nb_xO_y$).

19. The method of claim 15, wherein a thickness of the second semiconductor die is included in a range of approximately 0.5 microns to approximately 5 microns.

20. The method of claim 15, wherein an equivalent surface charge density of the high-k dielectric layer is included in a range of approximately $-8\times10^{-9}$ coulombs per square centimeter (C/cm$^2$) to approximately $-1.6\times10^{-7}$ C/cm$^2$.

* * * * *